(12) United States Patent
Sakata et al.

(10) Patent No.: US 9,720,335 B2
(45) Date of Patent: Aug. 1, 2017

(54) DRIVING SYSTEM AND DRIVING METHOD, AND EXPOSURE APPARATUS AND EXPOSURE METHOD

(71) Applicant: NIKON CORPORATION, Tokyo (JP)

(72) Inventors: Koichi Sakata, Yokohama (JP); Hiroyoshi Asaumi, Kawasaki (JP)

(73) Assignee: NIKON CORPORATION, Tokyo (JP)

(*) Notice: Subject to any disclaimer, the term of this patent is extended or adjusted under 35 U.S.C. 154(b) by 109 days.

(21) Appl. No.: 14/413,980

(22) PCT Filed: Jul. 9, 2013

(86) PCT No.: PCT/JP2013/004250
§ 371 (c)(1),
(2) Date: Mar. 13, 2015

(87) PCT Pub. No.: WO2014/010233
PCT Pub. Date: Jan. 16, 2014

(65) Prior Publication Data
US 2015/0293463 A1 Oct. 15, 2015

(30) Foreign Application Priority Data
Jul. 9, 2012 (JP) .................... 2012-153752

(51) Int. Cl.
*G03B 27/58* (2006.01)
*G03F 7/20* (2006.01)
(Continued)

(52) U.S. Cl.
CPC ...... *G03F 7/70775* (2013.01); *G03F 7/70483* (2013.01); *G03F 7/70725* (2013.01); *G05B 19/19* (2013.01); *G05B 19/402* (2013.01)

(58) Field of Classification Search
CPC ............ G03F 7/70483; G03F 7/70725; G03F 7/70775; G05B 19/19; G05B 19/402; G05D 3/12
See application file for complete search history.

(56) References Cited

U.S. PATENT DOCUMENTS

| 5,729,331 A | 3/1998 | Tanaka et al. |
| 6,611,316 B2 | 8/2003 | Sewell |

(Continued)

FOREIGN PATENT DOCUMENTS

| JP | 2002-073111 A | 3/2002 |
| JP | 2006-203113 A | 8/2006 |

OTHER PUBLICATIONS

Jan. 26, 2016 Office Action issued in Chinese Patent Appliction No. 201380042747.7.

(Continued)

*Primary Examiner* — Deoram Persaud
(74) *Attorney, Agent, or Firm* — Oliff PLC

(57) ABSTRACT

A synthetic controlled variable is obtained by obtaining a synthetic quantity using measurement results of a first and a second measuring instruments and corresponding gains (or transfer function) and synthesizing the synthetic quantity and one of the measurement results of the first and the second measuring instruments, respectively, via a high pass filter and a low pass filter. A feedback control system is structured that obtains a control input using a synthetic controlled variable and a desired value, and gives a plant the control input. This makes adding of a high pass filter for removing offset of installation position of the first and the second measuring instruments no longer necessary, and allows a driving system which controls robust driving in a high bandwidth of a plate stage regardless of bandwidth in which resonance appears to be designed.

48 Claims, 15 Drawing Sheets

(51) Int. Cl.
*G05B 19/402* (2006.01)
*G05B 19/19* (2006.01)

(56) References Cited

U.S. PATENT DOCUMENTS

| | | | |
|---|---|---|---|
| 6,744,511 B1 | 6/2004 | Saiki et al. | |
| 2010/0157264 A1* | 6/2010 | Butler | G03F 7/709 |
| | | | 355/53 |
| 2011/0177461 A1* | 7/2011 | Shibazaki | G03F 7/70775 |
| | | | 430/325 |
| 2011/0193510 A1* | 8/2011 | Fleming | G01Q 10/065 |
| | | | 318/611 |
| 2013/0037687 A1* | 2/2013 | Furumoto | F16F 15/002 |
| | | | 248/550 |
| 2014/0028992 A1* | 1/2014 | Fujimoto | G03F 7/70725 |
| | | | 355/72 |

OTHER PUBLICATIONS

Aug. 20, 2013 International Search Report issued in Application No. PCT/JP2013/004250.
Aug. 20, 2013 Written Opinion issued in International Application No. PCT/JP2013/004250.

* cited by examiner

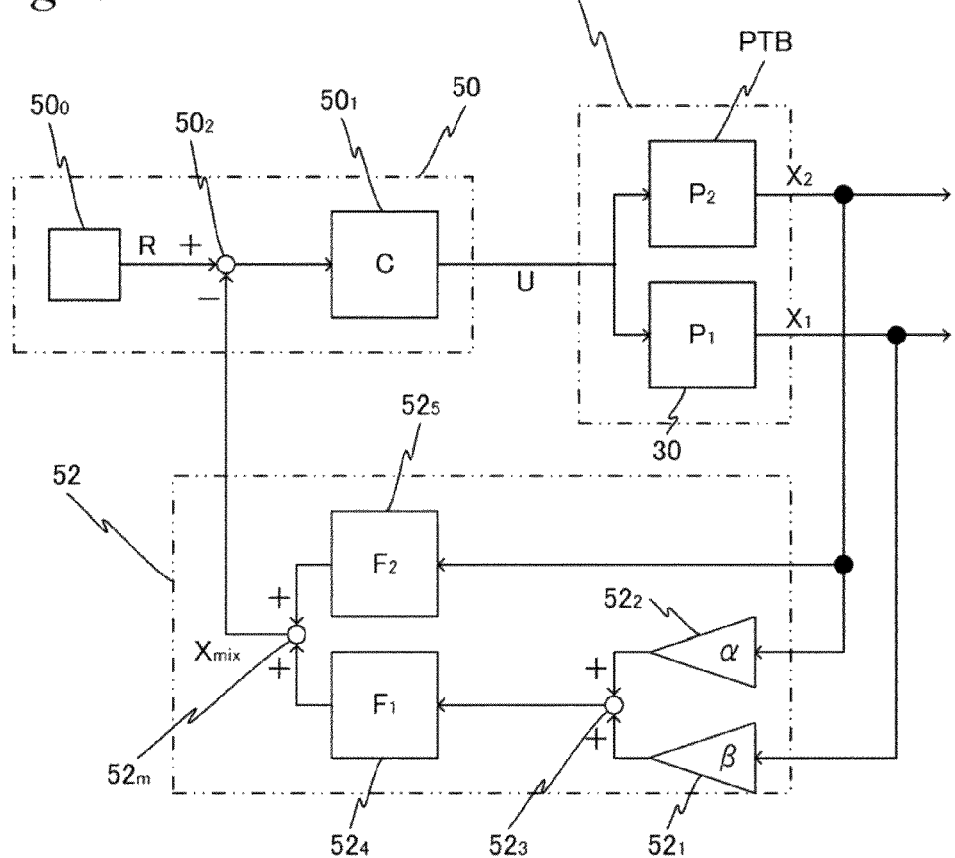

| $M_1$ | 1414 kg |
|---|---|
| $M_2$ | 2534 kg |
| J | 5489 kg/m² |
| L | 0.5326 m |
| l | 0.8 m |
| μ | 43660 Nm(rad/s) |
| k | 73199000 Nm/rad |
| c | 100 N(m/s) |

DRIVING SYSTEM AND DRIVING METHOD, AND EXPOSURE APPARATUS AND EXPOSURE METHOD

TECHNICAL FIELD

The present invention relates to driving systems and driving methods, and exposure apparatuses and exposure methods, and more particularly to a driving system and a driving method for driving a plant by providing a control input, an exposure apparatus equipped with the driving system, and an exposure method that uses the driving method.

BACKGROUND ART

In a lithography process for manufacturing electronic devices (micro-devices) such as a liquid crystal display device, a semiconductor device and the like, a projection exposure apparatus of a step-and-repeat method (a so-called stepper), a projection exposure apparatus of a step-and-scan method (a so-called scanning stepper (also called a scanner)), and the like are mainly used. As for exposure apparatuses for liquid crystal display devices (liquid crystal exposure apparatus), due to the increasing size of the substrates, a scanning type projection exposure apparatus such as the scanner is now mainstream.

Electronic devices (micro-devices) are manufactured by forming a plurality of layers of patterns that are overlaid on a substrate (a glass plate, a wafer and the like). Therefore, in the exposure apparatus, it is necessary to accurately overlay and transfer a pattern of a mask onto a pattern which is already formed in each shot area on the substrate, that is, high overlay accuracy is required.

To achieve the high overlay accuracy, a precise and stable control technique of a substrate stage which moves holding the substrate will be required. Here, in recent years, as the substrate stage, a gantry stage which is equipped with a carriage that moves in a scanning direction of the substrate at the time of scanning exposure and a substrate table that is supported on the carriage and moves in a non-scanning direction holding the substrate is mainly employed. In the gantry stage and the like, resonance occurs which becomes a failure cause to an accurate and stable control of the substrate stage. Especially recently, with size of the substrate stage increasing, the resonance frequency tends to be low.

As a theoretical framework to structure a control system using a notch filter, the control system being of a high frequency band including a resonance region of such substrate stages and also being robust to variation of resonant frequency, a stage controller is known that utilizes an advanced robust control theory represented by an H-infinity control theory (for example, refer to PTL 1). In the advanced robust control theory, while a sensor is added to make a plant a single-input multiple-output system, there are no restrictions to placement of the added sensor, and further, a feedback controller which is also stable to a modeling error of a nominal model can be designed. However, because degrees of freedom when designing a controller increases in general according to the plant structure, order of a weight function and the like, a trade-off relation occurs between high bandwidth and robustness of the feedback controller.

CITATION LIST

Patent Literature

[PTL 1] Japanese Unexamined Patent Application Publication No. 2002-73111

SUMMARY OF THE INVENTION

Means for Solving the Problems

According to a first aspect, there is provided a first driving system which drives a plant by giving control input, the system comprising: a first measuring instrument which measures a first controlled variable related to a position of a first section of the plant; a second measuring instrument which measures a second controlled variable related to a position of a second section of the plant that shows a behavior including a resonance mode in opposite phase to a rigid-body mode that the first section shows; and a controller which obtains a third controlled variable by performing a filter processing on a measurement result of the first and the second measuring instruments, and gives the control input obtained using the third controlled variable to the plant.

According to this system, the plant can be driven precisely and in a stable manner.

According to a second aspect, there is provided a first exposure apparatus that exposes an object with an energy beam and forms a pattern on the object, the apparatus comprising: the first driving system of the present invention in which a movable body that holds the object and moves on a predetermined plane serves as the plant.

According to this apparatus, the movable body holding the object can be driven precisely and in a stable manner, which in turn allows exposure with high precision to the object.

According to a third aspect, there is provided a second driving system which drives a plant by giving a control input, the system comprising: a first measuring instrument which measures a first controlled variable related to a position of a first section of the plant; a second measuring instrument which measures a second controlled variable related to a position of a second section of the plant that shows a behavior including a resonance mode in opposite phase to a rigid-body mode that the first section shows; and a controller which obtains a third controlled variable by obtaining a plurality of synthetic quantities ($X_{cn} = \alpha_n X_2 + \beta_n X_1$ (n=1 to N)) using measurement results of the first and the second controlled variables ($X_2$, $X_1$) by the first and the second measuring instruments and a plurality of sets (N ($\geq 2$) sets) of transfer function ($\alpha_n$, $\beta_n$ (n=1 to N)) and performing filter processing on the plurality of synthetic quantities and one of the measurement results of the first and the second measuring instruments, and gives the control input which is obtained using the third controlled variable to the plant.

According to this system, the plant can be driven precisely and in a stable manner.

According to a fourth aspect, there is provided a second exposure apparatus that exposes an object with an energy beam and forms a pattern on the object, the apparatus comprising: the second driving system of the present invention in which a movable body that holds the object and moves on a predetermined plane serves as the plant.

According to this apparatus, the movable body holding the object can be driven precisely and in a stable manner, which in turn allows exposure with high precision to the object.

According to a fifth aspect, there is provided a third exposure apparatus that exposes an object with an energy beam and forms a pattern on the object, the apparatus comprising: a movable body which has a first movable body that moves holding the object, and a second movable body that moves on a predetermined plane holding the first movable body; a first and a second measuring instrument that respectively measure a first and a second controlled variable related to a position of the first and the second movable bodies; and a controller which obtains a third controlled variable by performing filter processing on measurement results of the first and the second measuring instruments, and drives the movable body by giving the control input obtained using the third controlled variable to the movable body.

According to this apparatus, the movable body holding the object can be driven precisely and in a stable manner, which in turn allows exposure with high precision to the object.

According to a sixth aspect, there is provided a first driving method in which a plant is driven by giving a control input, the method comprising: measuring a first controlled variable related to a position of a first section of the plant and a second controlled variable related to a position of a second section of the plant that shows a behavior including a resonance mode in opposite phase to a rigid-body mode that first section shows; and obtaining a third controlled variable by performing a filter processing on measurement results of the first and the second controlled variables, and driving the plant by giving the control input which is obtained using the third controlled variable.

According to this method, the plant can be driven precisely and in a stable manner.

According to a seventh aspect, there is provided a first exposure method that exposes an object with an energy beam and forms a pattern on the object, the method comprising: driving a movable body that holds the object and moves on a predetermined plane as the plant by the first driving method of the present invention.

According to this method, the movable body holding the object can be driven precisely and in a stable manner, which in turn allows exposure with high precision to the object.

According to an eighth aspect, there is provided a second driving method in which a plant is driven by giving a control input, the method comprising: measuring a first controlled variable related to a position of a first section the plant and a second controlled variable related to a position of a second section of the plant that shows a behavior including a resonance mode in opposite phase to a rigid-body mode that the first section shows; and obtaining a third controlled variable by obtaining a plurality of synthetic quantities $(X_{cn} = \alpha_n X_2 + \beta_n X_1$ (n=1 to N)) using measurement results of the first and the second controlled variables $(X_2, X_1)$ and a plurality of sets (N (≥2) sets) of transfer function ($\alpha_n$, $\beta_n$ (n=1 to N)), performing filter processing on the plurality of synthetic quantities and one of the measurement results of the first and the second controlled variables, and driving the plant by giving the control input which is obtained using the third controlled variable.

According to this method, the plant can be driven precisely and in a stable manner.

According to a ninth aspect, there is provided a second exposure method that exposes an object with an energy beam and forms a pattern on the object, the method comprising: driving a movable body that holds the object and moves on a predetermined plane as the plant by the second driving method of the present invention.

According to this method, the movable body holding the object can be driven precisely and in a stable manner, which in turn allows exposure with high precision to the object.

According to a tenth aspect, there is provided a third exposure method that exposes an object with an energy beam and forms a pattern on the object, the method comprising: measuring a first controlled variable related to a position of a first movable body which moves holding the object, and a second controlled variable related to a position of a second movable body which moves on a predetermined plane holding the first movable body; and driving a movable body by obtaining a third controlled variable, which is obtained performing filter processing on measurement results of the first and the second controlled variables, and giving to the movable body a control input obtained using the third controlled variable.

According to this method, the movable body holding the object can be driven precisely and in a stable manner, which in turn allows exposure with high precision to the object.

According to an eleventh aspect, there is provided a device manufacturing method, comprising: forming a pattern on an object using the second or the third exposure method of the present invention, and developing the object on which the pattern is formed.

BRIEF DESCRIPTION OF DRAWINGS

FIG. 6 is a block diagram expressing a feedback control system (FS-SRC) of a single-input two-output system related to the first embodiment.

BEST MODE FOR CARRYING OUT THE INVENTION

A First Embodiment

Hereinafter, a first embodiment of the present invention will be described, using FIGS. 1 to 12.

Figure 1:
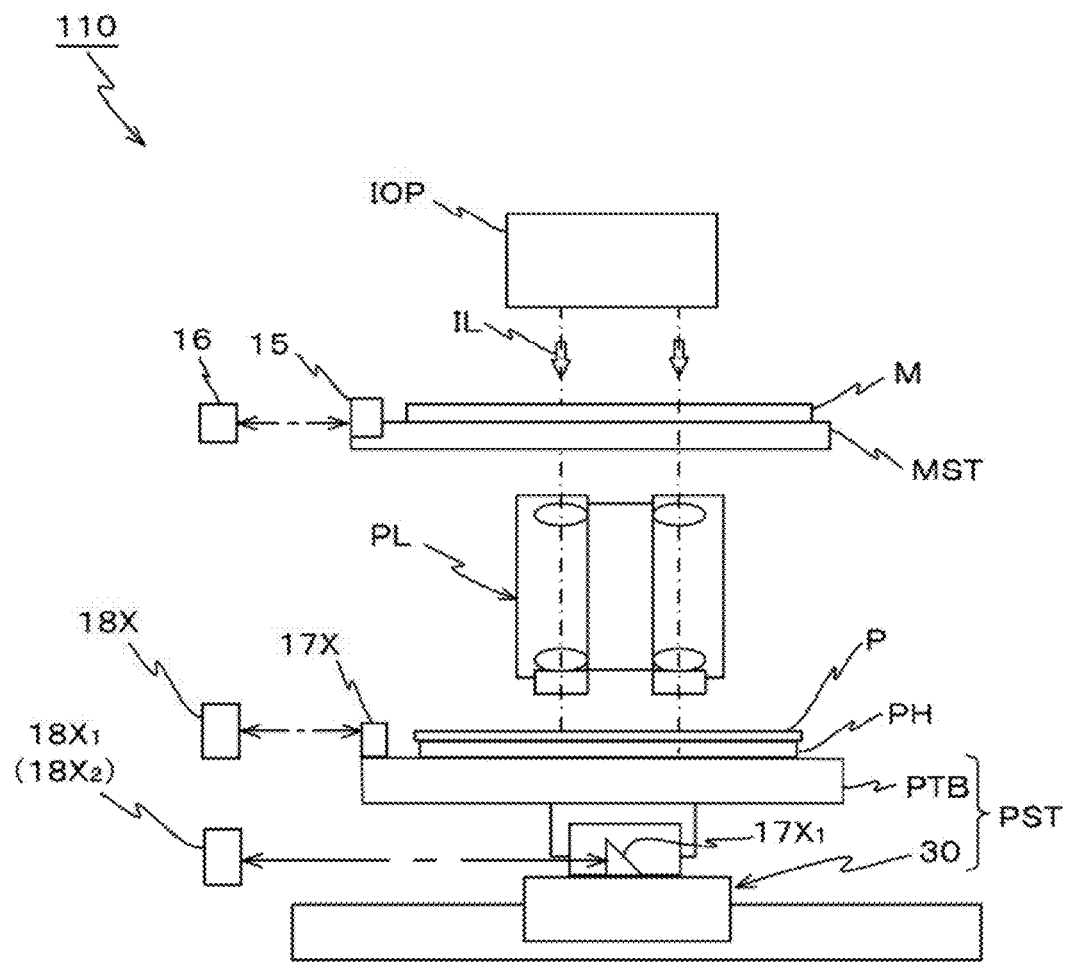
FIG. 1 is a view schematically showing a structure of an exposure apparatus related to a first embodiment.

In FIG. 1, a schematic structure is shown of an exposure apparatus 110 used when manufacturing flat panel displays related to the present embodiment, such as, for example, a liquid crystal display device (a liquid crystal panel). Exposure apparatus 110 is a scanning stepper (scanner) which relatively scans a mask M on which a liquid crystal display device pattern is formed and a glass plate (hereinafter, referred to as a "plate") P held by a plate stage PST along a predetermined scanning direction (here, an X-axis direction which is a lateral direction within the page surface of FIG. 1) with respect to a projection optical system PL at the same velocity in the same direction, and transfers a pattern of mask M on plate P. In the description below, a direction in which mask M and plate P are each relatively scanned with respect to projection optical system PL at the time of exposure will be described as the X-axis direction (X direction), a direction orthogonal to the X-axis direction within a horizontal plane will be described as a Y-axis direction (Y direction), and a direction orthogonal to an X-axis and a Y-axis will be described as a Z-axis direction (Z direction), and rotation (tilt) directions around the X-axis, the Y-axis, and the Z-axis will be described as θx, θy, and θz directions, respectively.

Exposure apparatus 110 is equipped with an illumination system IOP, a mask stage MST which holds mask M, projection optical system PL, a body which is not shown on which mask stage MST, projection optical system PL and the like are mounted, a plate stage PST which holds plate P via a plate holder PH, a control system for these parts, and the like. The control system is mainly structured by a main controller (not shown) which has overall control of each section structuring exposure apparatus 110 and a stage controller 50 (refer to FIG. 3 and the like) which operates under the control of the main controller.

Illumination system IOP is structured similarly to an illumination system disclosed in, for example, U.S. Pat. No. 5,729,331 and the like. That is, illumination system IOP irradiates light emitted from a light source which is not shown (for example, a mercury lamp) on mask M as an exposure illumination light (illumination light) IL, via a reflection mirror, a dichroic mirror, a shutter, a wavelength selection filter, various kinds of lenses and the like, each of which are also not shown. As illumination light IL, for example, light such as an i-line (wavelength 365 nm), a g-line (wavelength 436 nm), or an h-line (wavelength 405 nm) (or, a synthetic light of the i-line, the g-line, and the h-line described above) is used. Further, wavelength of illumination light IL can be switched appropriately by the wavelength selection filter, for example, according to the resolution that is required.

To mask stage MST, mask M which has a circuit pattern and the like formed on its pattern surface (the lower surface in FIG. 1) is fixed, for example, by vacuum chucking (or electrostatic suction). Mask stage MST is supported in a non-contact state (supported by levitation), via a gas static bearing (for example, an air bearing) which is not shown, on a pair of mask stage guides (not shown) extending in the X-axis direction fixed to an upper surface of a barrel surface plate which is a part of the body that is not shown. Mask stage MST is driven in predetermined strokes in the scanning direction (the X-axis direction), for example, by a mask stage driving system MSD (not shown in FIG. 1, refer to FIG. 3) that includes a linear motor, and is also finely driven in the Y-axis direction and the θz direction, respectively. Position information (including rotation information in the θz direction) within an XY plane of mask stage MST is measured by a mask interferometer system 16.

Mask interferometer system 16 irradiates a measurement beam on a movable mirror (or a mirror-polished reflection surface) 15 provided on an edge of mask stage MST, and measures the position of mask stage MST by receiving a reflected light from movable mirror 15. The measurement results are supplied to stage controller 50 (refer to FIG. 3), and stage controller 50 drives mask stage MST, via mask stage driving system MSD, based on the measurement results of mask interferometer system 16.

Projection optical system PL is supported by a part of the body which is not shown (barrel surface plate), below mask stage MST in FIG. 1. Projection optical system PL is structured similarly to the projection optical system disclosed in, for example, U.S. Pat. No. 5,729,331. That is, projection optical system PL includes a plurality of, for example, five projection optical systems (a multi-lens projection optical system) whose projection areas of a pattern image of mask M are placed, for example, in a staggered manner, and functions equally to a projection optical system that has a single image field of a rectangular shape with the Y-axis direction being the longitudinal direction. Here, three projection optical systems are placed at a predetermined spacing in the Y-axis direction, and the remaining two projection optical systems are set apart from the three projection optical system to the +X side and placed at a predetermined spacing in the Y-axis direction. In the present embodiment, as each of the plurality of (five) projection optical systems, for example, an equal magnifying system is used which is telecentric on both sides and forms an upright image. Further, hereinafter, the plurality of projection areas that are placed in a staggered manner of projection optical system PL will be referred to collectively as an exposure area.

When the illumination area on mask M is illuminated by illumination light IL from illumination system IOP, by illumination light IL that has passed through mask M, a projection image (a partially erected image) of the circuit pattern of mask M within the illumination area is formed via projection optical system PL, in an irradiation area (exposure area) of illumination light IL which is conjugate to an illumination area on plate P whose surface is coated with a resist (sensitive agent) that is placed on an image plane side of projection optical system PL. Then, by mask stage MST and the plate stage being synchronously driven, and mask M being relatively moved in the scanning direction (the X-axis direction) with respect to the illumination area (illumination light IL) while plate P is relatively moved in the scanning direction (the X-axis direction) with respect to the exposure area (illumination light IL), scanning exposure of plate P is performed, and the pattern of mask M is transferred on plate P. That is, in the present embodiment, the pattern of mask M is generated on plate P by illumination system IOP and projection optical system PL, and the pattern is formed on plate P by exposing the sensitive layer (resist layer) on plate P with illumination light IL.

Plate stage PST is placed below projection optical system PL (on the −Z side). Plate stage PST is equipped with a carriage 30 which moves in the X-axis direction (scanning direction), and a plate table PTB supported on carriage 30 that moves in the non-scanning direction holding plate P.

Figure 2:
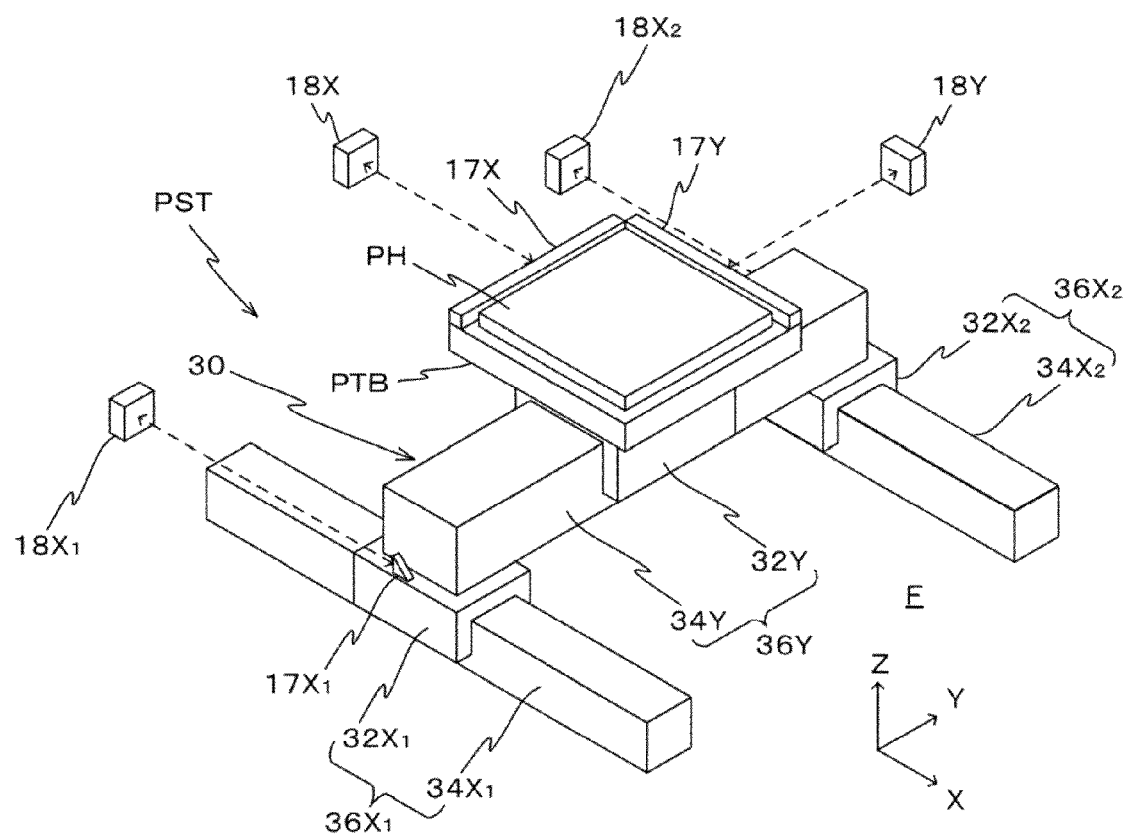
FIG. 2 is a perspective view showing a plate stage.
Figure 3:
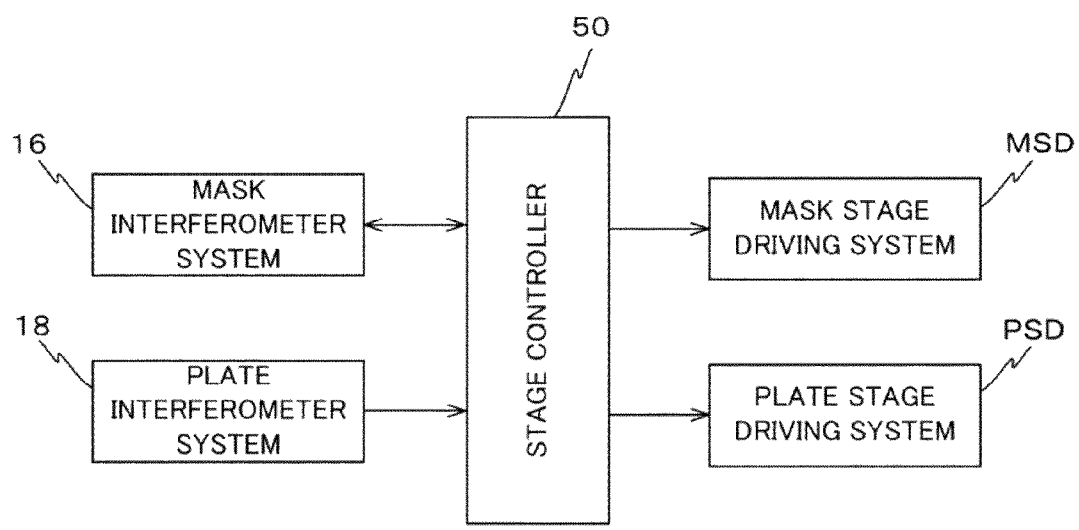
FIG. 3 is a block diagram showing a structure related to stage control of the exposure apparatus.

FIG. 2 shows plate stage PST in a perspective view, along with plate interferometer system 18 (18X, 18Y, $18X_1$, and $18X_2$, refer to FIG. 3). Plate table PTB, as shown in FIG. 2, consists of a plate-like member which is rectangular-shaped in a planar view, and in the center of its upper surface, plate holder PH which holds plate P by suction is fixed (not shown in FIG. 2, refer to FIG. 1). Plate table PTB is supported on a Y slider 32Y via a plurality of, for example, three support mechanisms (not shown). Each support mechanism supports plate table PTB, and also includes an actuator (for example, a voice coil motor or the like) which drives plate table PTB in the Z-axis direction at the supporting point. By the three support mechanisms, plate table PTB is finely driven in directions of three degrees of freedom (in each of the Z-axis, the θx direction and the θy direction) on Y slider 32Y.

Y slider 32Y has an XZ section which is an inverted U-shape, and engages from above in a non-contact manner with a Y beam (Y guide) 34Y extending in the Y-axis direction via an air bearing (not shown) and the like. Inside Y beam 34, for example, a plurality of coils are placed in the Y-axis direction at a predetermined spacing, and on an inner surface side of Y slider 32Y, for example, a plurality of permanent magnets are placed. By Y beam 34Y and Y slider 32Y, a moving-magnet-type Y linear motor 36Y is structured which drives Y slider 32Y serving as a mover in the Y-axis direction. Plate table PTB is driven in the Y-axis direction along Y beam 34Y by Y linear motor 36Y. Incidentally, Y linear motor 36Y is not limited to the moving-magnet-type, and a moving-coil-type linear motor can also be used.

To a lower surface at one end and the other end in the longitudinal direction of Y beam 34Y, X sliders $32X_1$ and $32X_2$ are fixed. X sliders $32X_1$ and $32X_2$ each have a YZ section which is an inverted U-shape, and are placed spaced apart in the Y-axis direction, and also engage from above in a non-contact manner with a pair of X guides $34X_1$ and $34X_2$ extending in the X-axis direction via an air bearing (not shown) and the like. X guides $34X_1$ and $34X_2$ are each installed, via a vibration isolation member which is not shown (or directly) on a floor surface F.

Inside each of the X guides $34X_1$ and $34X_2$, for example, a plurality of coils are placed in the X-axis direction at a predetermined spacing, and on an inner surface of each of the X sliders $32X_1$ and $32X_2$, a plurality of permanent magnets are placed. By X guide $34X_1$ and X slider $32X_1$, a moving-magnet-type X linear motor $36X_1$ is structured which drives X slider $32X_1$ serving as a mover in the X-axis direction. Similarly, by X guide $34X_2$ and X slider $32X_2$, a moving-magnet-type X linear motor $36X_2$ is structured which drives X slider $32X_2$ serving as a mover in the X-axis direction.

Here, carriage 30 (refer to FIG. 1) is structured including the pair of X sliders $32X_1$ and $32X_2$ and Y beam 34Y, and carriage 30 is driven in the X-axis direction by the pair of X linear motors $36X_1$ and $36X_2$. Further, by the pair of X linear motors $36X_1$ and $36X_2$ generating different thrusts (driving forces), carriage 30 is driven in the θz direction by the pair of X linear motors $36X_1$ and $36X_2$. Incidentally, X linear motors $36X_1$ and $36X_2$ are not limited to the moving-magnet-type, and a moving-coil-type linear motor can also be used.

In the present embodiment, by Y linear motor 36Y, the pair of X linear motors $36X_1$ and $36X_2$, and the three support mechanisms (not shown) described above, a plate stage driving system PSD (refer to FIG. 3) is structured which drives plate table PTB in directions of six degrees of freedom (in each of the X-axis, the Y-axis, the Z-axis, the θx, the θy, and the θz directions). Stage controller 50 has control over (each section structuring) plate stage driving system PSD (refer to FIG. 3).

Referring back to FIG. 2, on the upper surface of plate table PTB, plate holder PH that holds plate P is fixed in the center. Further, on the upper surface of plate table PTB, at the −X end and the +Y end, a movable mirror (flat mirror) 17X having a reflection surface orthogonal to the X-axis and a movable mirror (flat mirror) 17Y having a reflection surface orthogonal to the Y-axis are fixed, respectively. Further, a corner cube $17X_1$ is fixed on the upper surface of X slider $32X_1$, and a corner cube (not shown) is fixed on the upper surface of X slider $32X_2$, respectively.

A position of plate stage PST is measured by plate interferometer system 18 (refer to FIG. 3). Plate interferometer system 18 includes the four interferometers 18X, 18Y, $18X_1$ and $18X_2$ shown in FIG. 2.

Interferometer 18X irradiates at least three measurement beams parallel to the X-axis on movable mirror 17X provided on plate table PTB, and measures the position of plate table PTB in the X-axis direction, the θz direction, and the θY direction by receiving each of the reflected lights. Interferometer 18Y irradiates at least two measurement beams parallel to the Y-axis on movable mirror 17Y provided on plate table PTB, and measures the position of plate table PTB in the Y-axis direction and the θx direction by receiving each of the reflected lights.

Interferometer $18X_1$ irradiates a measurement beam parallel to the X-axis on corner cube $17X_1$ fixed on X slider $32X_1$, and measures the position of carriage 30 in the X-axis direction (X position) by receiving the reflected light. Similarly, interferometer $18X_2$ irradiates a measurement beam parallel to the X-axis on the corner cube (not shown) fixed on X slider $32X_2$, and measures the position of carriage 30 in the X-axis direction (X position) by receiving the reflected light.

Measurement results of each interferometer of plate interferometer system 18 are supplied to stage controller 50 (refer to FIG. 3). Stage controller 50, as it will be described later on, drives plate stage PST (plate table PTB) within the XY plane using velocity of plate stage PST, via plate stage driving system PSD (to be more precise, the pair of X linear motors $36X_1$ and $36X_2$ and Y linear motor 36Y). Here, stage controller 50 calculates the velocity of plate stage PST by making measurement results related to position from each interferometer of plate interferometer system 18 pass a differentiator. Further, when driving plate stage PST (plate table PTB) in the X-axis direction, as it will be described later on, measurement results of interferometer 18X, and measurement results of at least one of interferometers 18X₁ and 18X₂ are used.

Incidentally, stage controller 50 finely drives plate table PTB at least in one of the Z-axis, the θy, and the θz directions at the time of exposure and the like, based on detection results of a focus detection system which is not shown, via plate stage driving system PSD (to be more precise, the three support mechanisms (not shown)).

FIG. 3 shows a structure of a control system related to stage control of exposure apparatus 110. The control system in FIG. 3 is structured, for example, mainly of stage controller 50 which includes a microcomputer and the like.

In exposure apparatus 110, a plurality of shot areas of plate P is exposed in the following procedure, based on results of an alignment measurement of the plate performed in advance (for example, EGA and the like). That is, according to instructions from the main controller (not shown), stage controller 50 moves mask stage MST and plate stage PST to their scanning starting positions (acceleration starting positions), while monitoring the measurement results of mask interferometer system 16 and plate interferometer system 18. Then, stages MST and PST are synchronously driven in the same direction along the X-axis direction. Accordingly, the pattern of mask M is transferred onto a shot area on plate P in the manner previously described. During the scanning exposure, stage controller 50 finely adjusts the synchronous drive (relative position and relative velocity) of mask stage MST and plate stage PST, for example, according to a correction parameter. By this operation, the projection image of the pattern of mask M is aligned so as to overlay the pattern formed on a pre-processing layer.

When scanning exposure to one shot area is completed, stage controller 50 moves (steps) plate stage PST to a scanning starting position (acceleration starting position) for the next shot area. Then, scanning exposure to the next shot area is performed. By repeating the stepping between shot areas of plate P and the scanning exposure to the shot areas in the manner described so far, the pattern of mask M is transferred onto all of the shot areas on plate P.

Next, a design of a driving system (a control system for controlling the drive of plate stage PST) for plate stage PST will be described.

In the present embodiment, a driving system which drives plate stage PST in a translation direction, as an example, in the X-axis direction will be described. Further, for comparison, conventional art will also be briefly described.

In the conventional art, a feedback control system (a closed loop control system) which employs a single-input single-output system (SISO system) is structured. A case will be considered when the feedback control system of this single-input single-output system (SISO system) is applied to exposure apparatus 110. In this case, by interferometer 18X, an X position (controlled variable) of plate stage PST (plate table PTB) which serves as a plant is measured. Measurement results X are supplied to stage controller 50. Stage controller 50 obtains a control input U (a driving force F that X linear motors 36X₁, 36X₂ generate, or an electric current quantity I which is to be supplied to coils of X linear motors 36X₁, 36X₂ or the like) using measurement results X, and sends the obtained control input U to plate stage driving system PSD. Plate stage driving system PSD, according to control input U that has been received, for example, generates a driving force equivalent to driving force F, or supplies an equivalent quantity of electric current as electric current quantity I to the coils of X linear motors 36X₁, 36X₂. This controls the driving of plate stage PST.

Figure 4:
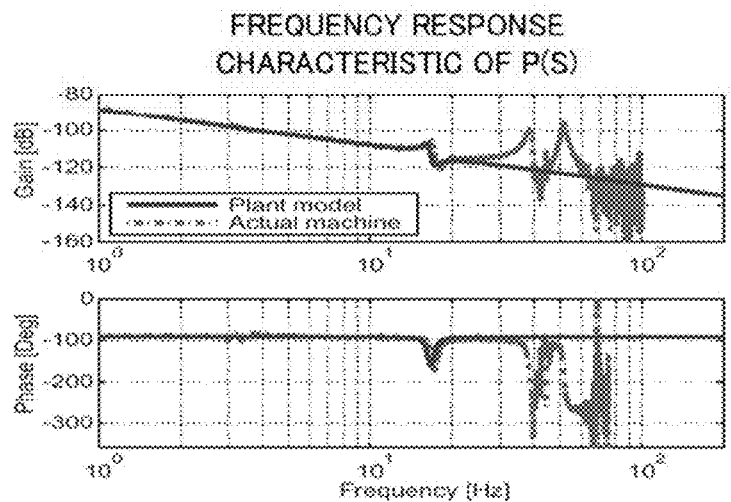
FIG. 4 is Bode diagram showing a frequency response characteristic of transfer function (amplitude and phase) which expresses an input-output response of the plate stage in a feedback control system in a single-input single-output system.

FIG. 4 shows a Bode diagram (amplitude (gain) |P(s)| and phase arg (P(s))) that shows a frequency response characteristic of a transfer function P (=X/U) which describes an input-output response (response of controlled variable X to control input U) of plate stage PST (plate table PTB) in the feedback control system of the single-input single-output system (SISO system) described above, that is, shows a gain diagram (view on the upper side) and a phase diagram (view on the lower side). Here, $s=j\omega=j2\pi f$, $j=\sqrt{(-1)}$, and f is frequency. In the drawing, for example, the solid line shows theoretical results which are obtained based on a dynamic model to be described later on, and the dashed line shows experimental results (results measured using an experimental unit). In the experiment, controlled variable X is measured with respect to control input U, and by applying the results to a definitional equation (P=X/U), the frequency response characteristic of transfer function P is obtained.

In the frequency response characteristic of transfer function P, it can be seen that a resonance mode (resonance behavior) appears around ten-odd Hz. Transfer function P, as a basic behavior, monotonously decreases its amplitude with respect to an increase in frequency f so that the phase is constantly maintained. These are shown in the gain diagram and the phase diagram as a straight line with a downward slope and a straight line with a zero slope, respectively. And, transfer function P, as a resonance behavior, sharply increases and then decreases its amplitude and sharply decreases and then increases its phase in around ten-odd Hz. These are shown in the gain diagram and the phase diagram as a successive peak and trough and a trough, respectively. That is, transfer function P, in around ten-odd Hz, shows a resonance mode in opposite phase to a rigid-body mode.

The resonance mode (resonance behavior) described above appears in lower frequency bands due to larger exposure apparatus in recent years, and has become a large setback for precise and stable control when driving plate stage PST. Incidentally, in the experimental results of the frequency response characteristic in FIG. 4, although sharp vibration behavior can be seen in the high frequency band (more than several tens of Hz), this will not be an issue here in particular.

To cancel out the resonance mode (resonance behavior) described above and to precisely and stably control the driving of plate stage PST, in addition to interferometer 18X (a first measuring instrument) of plate interferometer system 18, by using interferometer 18X₁ (a second measuring instrument) a feedback control system which employs a single-input two-output system (SIMO system) is structured. Here, while the position of carriage 30 can be measured either by interferometer 18X₁ or by interferometer 18X₂, or can also be obtained by averaging the measurement values of both interferometers, interferometer 18X₁ will be used in this case for the sake of convenience.

In the feedback control system of this single-input two-output system (SIMO system), by interferometers 18X and 18X₁, X positions (controlled variables) $X_2$, $X_1$ of plate table PTB (a first section of the plant) structuring plate stage PST (the plant) and carriage 30 (a second section of the plant) are measured, respectively. These measurement results ($X_2$, $X_1$) are supplied to stage controller 50. Stage controller 50 obtains control input U (driving force F) using the measurement results ($X_2$, $X_1$), and sends the obtained control input U to plate stage driving system PSD. Plate stage driving system PSD (X linear motors $36X_1$, $36X_2$) applies a driving force equivalent to driving force F to carriage 30 (the second section), according to control input U (driving force F) which has been received. This drives plate stage PST.

Figure 5A:
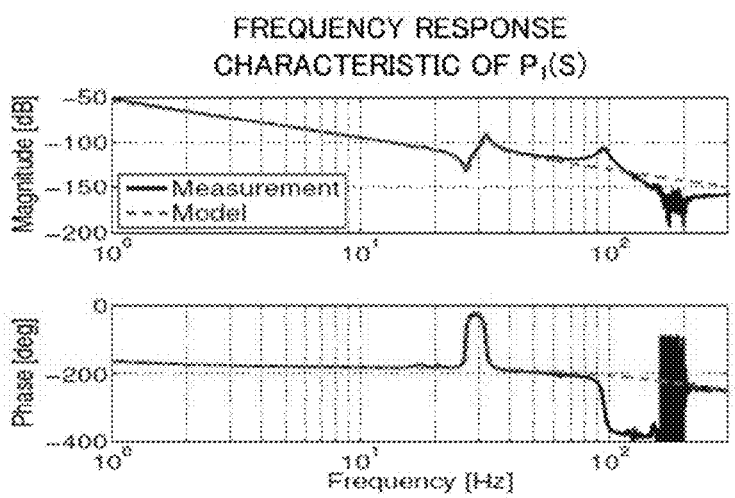
FIGS. 5A and 5B are Bode diagrams that respectively show a frequency response characteristic of a transfer function which expresses an input-output response of a carriage of the plate stage and a plate table in a feedback control system in a single-input two-output system.
Figure 5B:
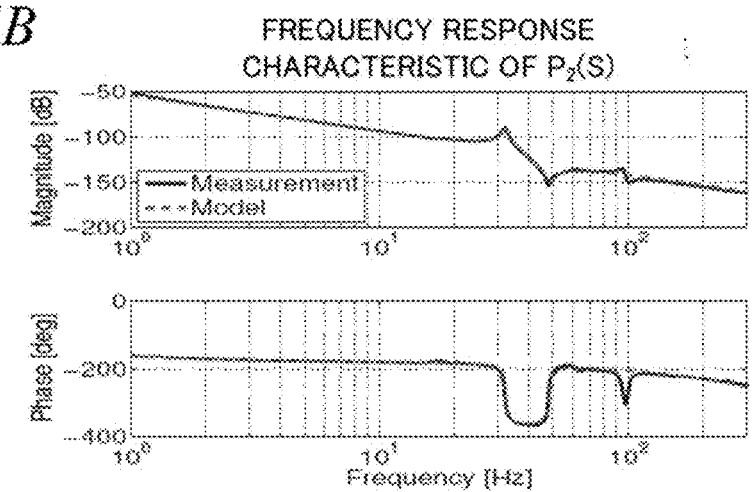

FIG. 5A shows a Bode diagram that shows a frequency response characteristic of transfer function P1 $(=X_1/U)$ which describes an input-output response (controlled variable $X_1$ with respect to control input U (driving force F)) of carriage 30, that is, shows a gain diagram (view on the upper side) and a phase diagram (view on the lower side). Further, FIG. 5B shows a Bode diagram that shows a frequency response characteristic of transfer function P2 $(=X_2/U)$ which describes an input-output response (controlled variable $X_2$ with respect to control input U (driving force F)) of plate table PTB, that is, shows a gain diagram (view on the upper side) and a phase diagram (view on the lower side).

The frequency response characteristic of transfer function $P_2$ to plate table PTB (refer to FIG. 5B) shows a behavior similar to the frequency response characteristic previously described (refer to FIG. 4). However, the frequency band in which the resonance behavior (resonance mode) appears shifts slightly to the high frequency side. On the contrary, the frequency response characteristic of transfer function P1 to carriage 30 shows a behavior opposing the frequency response characteristic of transfer function $P_2$ (resonance mode in opposite phase), that is, shows a resonance mode in phase with the rigid-body mode. Transfer function $P_1$ sharply decreases and then increases its amplitude to the increase of frequency f, and sharply increases and then decreases its phase. These are shown, in the gain diagram and the phase diagram in FIG. 5A, by a successive trough and peak, and a peak, respectively.

Further, an exposure apparatus that uses feedback control to a plant of a single-input two-output system (SIMO system) is disclosed in, Japanese Unexamined Patent Application Publication No. 2006-203113. However, the apparatus was still not sufficient because of the structure in which two outputs are synthesized as a single output and one controller is designed with respect to a plant of a single-input single-output system (SISO system).

Further, in exposure apparatus 110 of the present embodiment, there is an offset in the reference positions for position measurement of plate stage PST by interferometers 18X and $18X_1$, that is, in the installation positions of movable mirror 17X and corner cube $17X_1$. To remove this offset, a high pass filter has to be connected to the controller so as to cut off controlled variable $X_1$ in the low frequency band. However, this arrangement causes an abnormal behavior to appear in the frequency response characteristic due to the high pass filter as it will be described later on, even if the feedback control system is the SIMO system, which prevents the designed disturbance suppression characteristic from being obtained.

In exposure apparatus 110 related to the present embodiment, on building a feedback control system of a single-input two-output system (SIMO system), the second measuring instrument (interferometer $18X_1$ (corner cube $17X_1$)) is installed at the second section (carriage 30 (X slider $32X_1$) of plate stage PST which shows a behavior including a resonance mode in opposite phase to the rigid-body mode shown by the first section (plate table PTB) of plate stage PST where the first measuring instrument (interferometer 18X (movable mirror 17X)) is installed. By this arrangement, a desired feedback control system can be built.

FIG. 6 shows a block diagram showing a closed loop control system (feedback control system) of a single-input two-output system (SIMO system) corresponding to the driving system of plate stage PST related to the present embodiment. The driving system corresponding to this closed loop control system includes, interferometers 18X and $18X_1$ of plate interferometer system 18 that measure a position (the first controlled variable $X_2$) (in the X-axis direction) of the first section (plate table PTB) and a position (the second controlled variable $X_1$) (in the X-axis direction) of the second section (carriage 30) of plate stage PST serving as the plant, respectively, a synthetic section 52 which generates a synthetic controlled variable $(X_{mix})$ by synthesizing measurement results $(X_2, X_1)$ of the first and the second controlled variables, and stage controller 50 which computes control input U, based on a desired value R of plate stage PST and the generation results of synthetic controlled variable $(X_{mix})$, sends the results to plate stage driving system PSD, and controls the driving of plate stage PST. Here, although X positions $X_2$, $X_1$ are measured by interferometers 18X, $18X_1$, respectively, illustration is omitted in FIG. 6. In the block diagram of the closed loop control system hereinafter, illustration of the measuring instruments will be similarly omitted.

Here, while desired value (target trajectory), controlled variable, control input and the like are defined as a function of time, the description will be made using the Laplace transform of these functions in FIG. 6 and the description using the drawing, according to the practice in the case of explaining a control block diagram. Further, also for operational expression U $(R-X_{mix})$ to be described later on, the definition will be given in the form of the Laplace transform. Further, in the description below, unless it is noted in particular, the description will be made using the Laplace transform (in the form of the Laplace transform).

Stage controller 50 includes a target generating section $50_0$, a controller $50_1$, and a subtracter $50_2$. Incidentally, while each of these sections is actually realized by a microcomputer and software that structure stage controller 50, they can naturally be structured by hardware. Target generating section $50_0$ generates a desired value of plate stage PST, in this case, a target position (a desired value of a position which changes by the minute) R, and supplies the desired value to subtracter $50_2$. Subtracter $50_2$ calculates a difference between target position R and synthetic controlled variable $X_{mix}$ from synthetic section 52, that is, a deviation $(R-X_{mix})$, and supplies the deviation to controller $50_1$ (transfer function C). Controller $50_1$ calculates control input U=C $(R-X_{mix})$ by calculation (control operation), so that deviation $(R-X_{mix})$ becomes zero. Here, C is a transfer function of controller $50_1$. Transfer function is a ratio R(s)/C(s) of the Laplace transform of an input signal r(t) and an output signal C(t), that is, a Laplace transform function of an impulse response function. As is described, stage controller 50 obtains control input U by performing control operation expressed by operational expression U=C $(R-X_{mix})$, based on target position R and synthetic controlled variable $X_{mix}$ from synthetic section 52, and gives control input U to plate stage PST serving as the plant. This allows plate stage PST to be driven according to control input U, and the position of plate stage PST is controlled.

Synthetic section 52 includes comparators (proportional gain β, α) $52_1$, $52_2$, an adder $52_3$, a high pass filter $52_4$, a low pass filter $52_5$, and an adder $52_m$, generates synthetic controlled variable $(X_{mix})$ by synthesizing X position $X_2$ (current position) of plate table PTB (transfer function $P_2$) measured by interferometer 18X and X position $X_1$ (current position) of carriage 30 (transfer function $P_1$) measured by interferometer $18X_1$, and supplies the synthetic controlled variable to target generating section $50_0$ (subtracter $50_2$). Here, comparators (proportional gain β, α) $52_1$, $52_2$ multiply measurement results $X_1$, $X_2$ from interferometers $18X_1$, $18X$ by proportional gain β, α (β$X_1$, α$X_2$), and send the multiplied measurement results to adder $52_3$, respectively. Adder $52_3$ generates a sum (α$X_2$+β$X_1$) of the outputs from comparators $52_1$, $52_2$, and supplies the sum to high pass filter $52_4$. High pass filter $52_4$ and low pass filter $52_5$ have the same cutoff frequency fc, and high pass filter $52_4$ passes only frequency component $F_1$ (α$X_2$+β$X_1$) which is higher than cutoff frequency fc from among signal (α$X_2$+β$X_1$) from adder $52_3$, whereas low pass filter $52_5$ passes only frequency component F2 ($X_2$) which is lower than cutoff frequency fc from among measurement result $X_2$ from interferometer 18X, and supply the components to adder $52_m$, respectively. Adder $52_m$ synthesizes signal $F_1$ (α$X_2$+β$X_1$) from high pass filter $52_4$ and signal $F_2(X_2)$ from low pass filter $52_5$, generates synthetic controlled variable $X_{mix}$=$F_1$ (α$X_2$+β$X_1$)+$F_2$ ($X_2$), and supplies the synthetic controlled variable to stage controller 50 (subtracter $50_2$).

As a concrete example of high pass filter $52_4$ and low pass filter $52_5$, a primary filter given by formula (1a) below, a secondary filter given by formula (1b), and a quaternary filter given by formula (1c) may be included.

$$\begin{cases} F_1 = \dfrac{s}{s + \omega_f} \\ F_2 = 1 - F_1 \end{cases} \quad (1a)$$

$$\begin{cases} F_1 = \dfrac{s^2}{s^2 + 2\zeta\omega_f s + \omega_f^2} \\ F_2 = 1 - F_1 \end{cases} \quad (1b)$$

$$\begin{cases} F_1 = \dfrac{s^4 + a_{f3}s^3}{s^4 + a_{f3}s^3 + a_{f2}s^2 + a_{f1}s + a_{f0}} \\ F_2 = 1 - F_1 \end{cases} \quad (1c)$$

In formula (1a) and formula (1b), $\omega_f$=2πfc, using cutoff frequency fc.

$X_{mix}$ generated in the closed loop control system (feedback control system) having the structure described above is plant $X_2$ in the low frequency band where there is no resonance, and in the middle and high frequency bands where resonance exist, $X_{mix}$ is α$X_2$+β$X_1$ which cannot be observed with respect to resonance. Accordingly, transfer characteristic of plate stage PST and synthetic section 52 from the input of control input U to the output of synthetic quantity $X_{mix}$ can be described using an ideal rigid body model. Further, because synthetic quantity $X_{mix}$ is equivalent to $X_2$ in the low frequency band, the high pass filter does not have to be connected to the controller to remove the offset between the reference positions (installation positions of movable mirror 17X and corner cube $17X_1$) for position measurement of interferometers 18X and $18X_1$. Furthermore, stage controller 50 can be structured using only controller $50_1$ which is designed based on the rigid body model.

The closed loop control system (feedback control system) structured in the manner described above will be called a frequency separation SRC (FS-SRC) type control system.

In the present embodiment, to design comparators $52_1$, $52_2$, that is, to decide proportional gains β, α, a dynamical motion of plate stage PST is described using a simplified dynamic model (rigid model).

Figure 7:
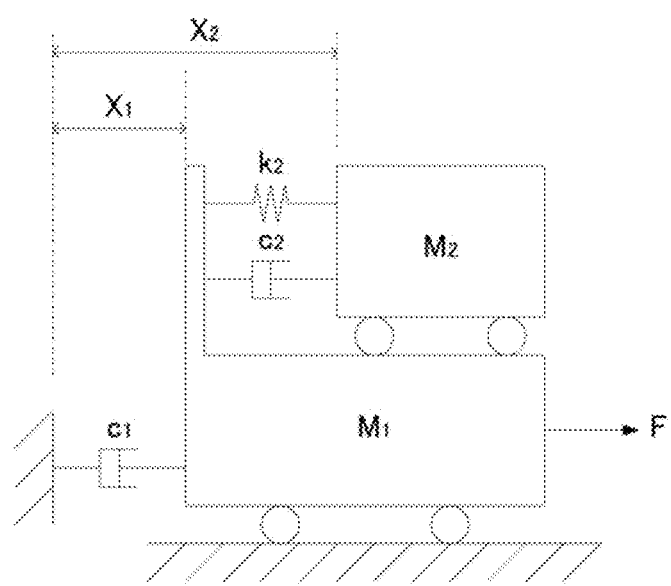
FIG. 7 is a view showing an example of a dynamic model that expresses a dynamical motion (translation motion) of the plate stage (a translation two-inertial system model).

FIG. 7 shows a first model, a translation two-inertial system model, which describes the dynamical motion (translation motion) of plate stage PST. Plate stage PST is to be structured from two parts which are plate table PTB on which the first measuring instrument (interferometer 18X) is installed and carriage 30 on which the second measuring instruments (interferometers $18X_1$, $18X_2$) are installed. And motion in the X-axis direction of these parts is expressed as a motion of two rigid bodies coupled by a spring and a damper, or to be more precise, described as a motion of a rigid body M1 (corresponding to carriage 30) translating in the X-axis direction by a driving force F given from a driving system corresponding to plate stage driving system PSD (X linear motor $36X_1$, $36X_2$) and a rigid body M2 (corresponding to plate table PTB) which is coupled to rigid body M1 via a spring and a damper and performs translation motion on rigid body M1. Incidentally, the two rigid bodies can be described, as being coupled by a spring and a damper, or as two or more rigid bodies including the two rigid bodies to which attention is focused on being coupled by a spring (or a spring and a damper).

Mass of the two rigid bodies (the first and the second rigid bodies) corresponding to carriage 30 and plate table PTB are to be described as $M_1$, $M_2$, respectively, rigidity coefficient and viscosity coefficient due to friction between the first and the second rigid bodies are to be $k_2$, $c_2$, respectively, viscosity coefficient for the first rigid body is to be $c_1$, and thrust acting on the second rigid body is to be F.

In the translation two-inertial system model described above, transfer functions $P_1$, $P_2$ that express input-output response (response of positions $X_1$, $X_2$ to driving force F) of the first and the second rigid bodies are given as follow in the form of Laplace transform.

$$P_1 = \frac{X_1}{F} = \frac{b_{12}s^2 + b_{11}s + b_{10}}{a_4 s^4 + a_3 s^3 + a_2 s^2 + a_1 s + a_0} \quad (2a)$$

$$P_2 = \frac{X_2}{F} = \frac{b_{22}s^2 + b_{21}s + b_{20}}{a_4 s^4 + a_3 s^3 + a_2 s^2 + a_1 s + a_0} \quad (2b)$$

However, $$\begin{cases} a_4 = M_1 M_2 \\ a_3 = c_1 M_2 + c_2 M_2 + c_2 M_1 \\ a_2 = k_2 M_2 + k_2 M_1 + c_1 c_2 \\ a_1 = c_1 k_2 \\ a_0 = 0 \\ b_{12} = M_2, \ b_{22} = 0 \\ b_{11} = b_{21} = c_2, \ b_{10} = b_{20} = k_2 \end{cases} \quad (3)$$

On the other hand, proportional gains α, β are decided in the following manner.

$$\begin{cases} \alpha = \dfrac{M_2}{M_1 + M_2} \\ \beta = 1 - \alpha \end{cases} \quad (4)$$

Since deciding proportional gains α, β are similar to that of deciding in an inverted pendulum model which will be described later on, a detailed description thereabout will be omitted. When transfer functions $P_1$, $P_2$ and proportional gains α, β are used, transfer characteristic of $X_3=\alpha X_2+\beta X_1$ to thrust F has a characteristic of an ideal rigid body model as follows.

$$P_3 = \frac{X_3}{F} = \frac{1}{(M_1+M_2)s^2+c_1 s} \quad (5)$$

Note that proportional gains α, β depend only on mass $M_1$, $M_2$, and do not depend on parameters such as spring constant $k_2$, viscosity coefficients $c_1$, $c_2$ that may change according to the state of plate stage PST. This means that unless the resonance mode of $P_1$, $P_2$ in the closed loop transfer function is canceled out and mass $M_1$, $M_2$ of the two rigid bodies (that is, mass of carriage 30 and plate table PTB) changes, the behavior of the closed loop transfer function remains unchanged regardless of any changes in the state of plate stage PST.

Figures 8A, 8B:
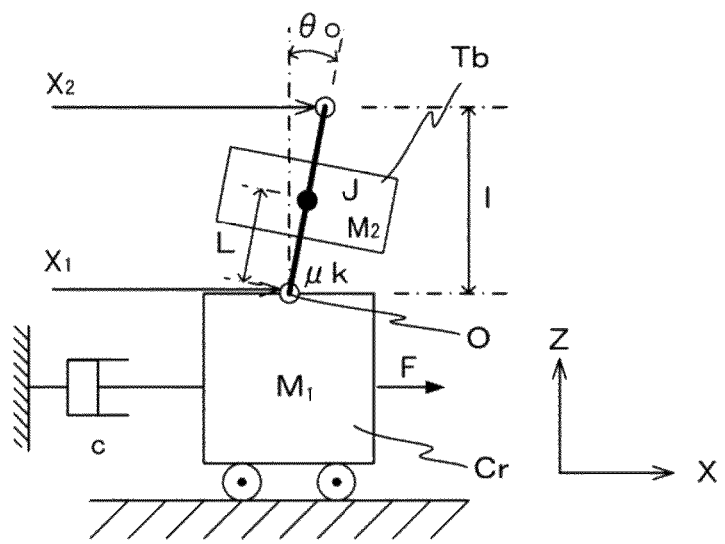
FIG. 8A is a view showing an example of a dynamic model that expresses a dynamical motion (translation motion) of the plate stage (an inverted pendulum model)
FIG. 8B is a table showing dynamic parameters included in the dynamic model of FIG. 8A.

FIG. 8A shows a second model, an inverted pendulum model which expresses a dynamical motion (translation motion) of plate stage PST. Plate stage PST is to be structured from two sections, which are plate table PTB on which the first measuring instrument (interferometer 18X) is installed and carriage 30 on which the second measuring instrument (interferometer $18X_1$) is installed. And, motion in the X-axis direction of these two sections is to be expressed as motion of the two rigid bodies coupled by a spring, or to be more specific, expressed as a motion of a rigid body Cr (corresponding to carriage 30) which is translated in the X-axis direction by driving force F given from a driving system corresponding to plate stage driving system PSD (X linear motor $36X_1$, $36X_2$) and a rigid body Tb (corresponding to plate table PTB) coupled via a spring at a rotation center O on rigid body Cr that rotates (in a $\theta_O$ direction) around rotation center O. Incidentally, the two rigid bodies can be described as being coupled by a spring and a damper, or two or more rigid bodies including the two rigid bodies in focus being coupled by a spring (or a spring and a damper).

Here, X positions of rigid bodies Cr, Tb are to be expressed as $X_1$, $X_2$, respectively, mass to be expressed as $M_1$, $M_2$, respectively, moment of inertia of rigid body Tb (regarding rotation center O) to be expressed as J, viscosity (resistance proportional to velocity of rigid body Cr) to be expressed as C, attenuation coefficient between rigid body Tb and rigid body Cr to be expressed as μ, spring constant (torsional rigidity between rigid body Tb and rigid body Cr) to be expressed as k, distance between the center of gravity of rigid body Tb and rotation center O to be expressed as L, and separating distance in the Z-axis direction between the reference positions of rigid bodies Cr and Tb on X position ($X_1$, $X_2$) measurement of rigid bodies Cr and Tb to be expressed as l. Incidentally, the table in FIG. 8B shows values of these dynamic parameters. These values are decided, using a least-squares method and the like so that model formulas expressed by formulas (2a) (2b), respectively, reproduce the frequency response characteristics of transfer functions $P_2$, $P_1$ obtained by applying experimental results of frequency response characteristics shown in FIGS. 5A and 5B, or in other words, by applying to formulas (2b) (2a) experimental results of the first and the second controlled variables $X_2$, $X_1$ with respect to control input U(F).

In the inverted pendulum model described above, transfer functions $P_1$, $P_2$ that express input-output response (response of positions $X_1$, $X_2$ to driving force F) of rigid bodies Cr, Tb are given by formulas (2a) and (2b). However, it is given in the manner described below.

$$\begin{cases} a_4 = M_1 M_2 L^2 + (M_1+M_2)J \\ a_3 = (M_1+M_2)\mu + (M_2 L^2+J)c \\ a_2 = (M_1+M_2)k - M_1 M_2 gL - M_2^2 gl + \mu c \\ a_1 = (k - M_2 gL)c \\ a_0 = 0 \\ b_{12} = M_2 L^2 + J \\ b_{22} = M_2 L^2 + J - M_2 Ll \\ b_{11} = b_{21} = \mu \\ b_{10} = b_{20} = k - M_2 gL \end{cases} \quad (6)$$

Proportional gains α, β (and transfer function C) are decided using transfer functions $P_1$, $P_2$ described above. For the sake of convenience, transfer functions $P_1$, $P_2$, C will be expressed in the form of fractional expressions $P_1=N P_1/D_P D_R$, $P_2=N P_2/D_P D_R$, and $C=1/D_C$. However, it is as follows.

$$N_{P1}=b_{12}s^2+b_{11}s+b_{10} \quad (7a)$$

$$NP_2=b_{22}s^2+b_{21}s+b_{20} \quad (7b)$$

$$D_P=s^2+c/(M_1+M_2)s \quad (7c)$$

$$D_R=a_4 s^2+(a_3-a_4 c/(M_1+M_2))s+a_1(M_1+M_2)/c \quad (7d)$$

In this case, characteristic equation $A_{CL}$ of a closed loop transfer function with respect to a feedback control system (FIG. 6) when $F_1=1$, $F_2=0$ is given, by a numerator part of fractional expression $1+C\beta P_1+C\alpha P_2$. That is, $$A_{CL}=D_C D_P D_R+\beta N_{P1}+\alpha N_{P2} \quad (8)$$

In characteristic equation $A_{CL}$, α, β are decided so that the following formula (9) is satisfied, using an arbitrary analytical function γ.

$$\beta N_{P1}+\alpha N_{P2}=\gamma D_R \quad (9)$$

From this, an open loop transfer function $\beta P_1+\alpha P_2=\gamma/D_C D_P$ is obtained, and pole zero cancellation is performed on poles giving resonance behaviors included in each of $P_1$, $P_2$ (that is, resonance mode that $P_1$, $P_2$ respectively show). Furthermore, $D_C$, γ are decided so that characteristic equation $A_{CL}$ has a stable pole (in this description, becomes a multiple root for the sake of convenience), that is, so that the following formula (10) is satisfied.

$$A_{CL}=(D_C D_P+\gamma)D_R=(s+\omega_1)(s+\omega_2)\ldots(s+\omega_n)D_R \quad (10)$$

Next, it is decided as follows by formulas (7a) to (7d) and formula (9), so that proportional gains α, β do not include $D_R$ that has a singularity (pole).

$$\begin{cases} \alpha = \dfrac{M_2 L/l}{M_1+M_2} \\ \beta = 1-\alpha \end{cases} \quad (11)$$

When transfer functions $P_1$, $P_2$ and proportional gains α, β are used, transfer characteristic of $X_3=\alpha X_2+\beta X_1$ to thrust F has a characteristic of an ideal rigid body model in good approximation as follows.

$$P_3 = \frac{X_3}{F} \approx \frac{1}{(M_1 + M_2)s^2 + cs} \quad (12)$$

On deciding the remaining $D_C$, $\gamma$, degrees of freedom remain to some extent. Therefore, PID controller is to be designed, for example, from comparators $52_1$, $52_2$ and controller $50_1$. By this, $D_C=s^2+b_1s$, $\alpha=b_2s^2+b_3s+b_4$ are obtained. However, $b_1=\omega_1+\omega_2+\omega_3+\omega_4-c/(M_1+M_2)$, $b_2=\omega_1\omega_2+\omega_1\omega_3+\omega_1\omega_4+\omega_2\omega_3+\omega_2\omega_4+\omega_3\omega_4-b_1c/(M_1+M_2)$, $b_3=\omega_1\omega_2\omega_3+\omega_1\omega_2\omega_4+\omega_2\omega_3\omega_4+\omega_1\omega_3\omega_4$, and $b_4=\omega_1\omega_2\omega_3\omega_4$.

Note that proportional gains $\alpha$, $\beta$ depend only on mass $M_1$, $M_2$ and distances L, l, and do not depend on parameters such as spring constant k, attenuation coefficient μ, viscosity c that may change according to the state of plate stage PST. This means that unless the resonance mode of $P_1$, $P_2$ in the closed loop transfer function is cancelled out and mass $M_1$, $M_2$ (that is, mass of carriage 30 and plate table PTB) of rigid bodies Cr, Tb and distances L, l change, the behavior of the closed loop transfer function remains unchanged regardless of any changes in the state of plate stage PST.

Figure 9:
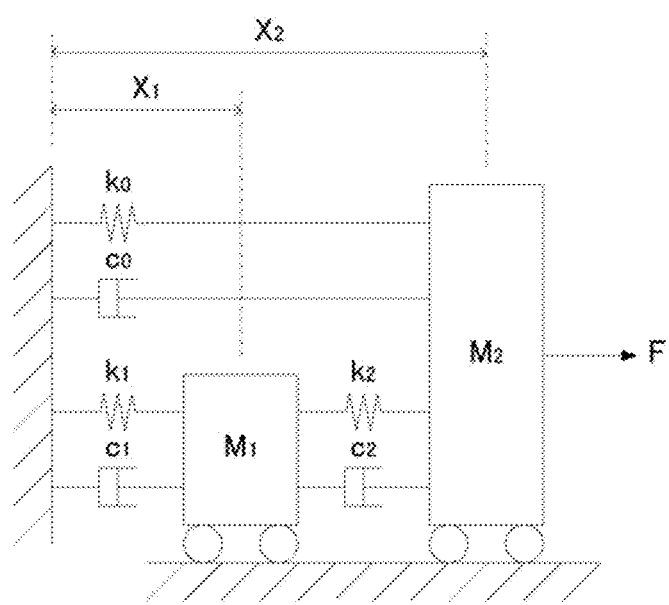
FIG. 9 is a view showing an example of a dynamic model that expresses a dynamical motion (translation motion) of the plate stage (a two-resonance two-inertial spring type model).

FIG. 9 shows a third model, a two-resonance two-inertial spring type model, which expresses a dynamical motion (translation motion) of plate stage PST. The two-resonance two-inertial spring type model expresses plate stage PST, which performs translation motion for each of the two sections, plate table PTB on which the first measuring instrument (interferometer 18X) is installed and carriage 30 on which the second measuring instrument (interferometer $18X_1$) installed, as a translation motion of two rigid bodies coupled by a spring and a damper. Incidentally, the two rigid bodies can be expressed as being coupled only by a spring, or two or more rigid bodies including the focused two rigid bodies can be coupled by a spring and a damper (or only by a spring).

Mass of the two rigid bodies (a first and a second rigid body) corresponding to plate table PTB and carriage 30 is to be $M_2$, $M_1$, respectively, rigidity coefficient and viscosity coefficient for the first rigid body are to be $k_0$, $c_0$, respectively, rigidity coefficient and viscosity coefficient for the second rigid body are to be $k_1$, $c_1$, respectively, rigidity coefficient and viscosity coefficient due to friction between the first and the second rigid bodies are to be $k_2$, $c_2$, respectively, and thrust acting on the first rigid body is to be F.

In the two-resonance two-inertial spring type model described above, transfer functions $P_1$, $P_2$ that express input-output response (response of positions $X_1$, $X_2$ to driving force F) of the first and the second rigid bodies are given by formulas (2a) and (2b). However, the following expression is applied.

$$\begin{cases} a_4 = M_1 M_2 \\ a_3 = M_1 c_2 + M_2 c_1 + M_2 c_2 + M_1 c_0 \\ a_2 = M_1 k_2 + M_2 k_1 + M_2 k_2 + M_1 k_0 + c_1 c_2 + c_0(c_1 + c_2) \\ a_1 = c_1 k_2 + c_2 k_1 + c_0(k_1 + k_2) + (c_1 + c_2)k_0 \\ a_0 = k_1 k_2 + k_0(k_1 + k_2) \\ b_{12} = 0, b_{22} = M_1 \\ b_{11} = c_2, b_{21} = c_1 + c_2, b_{10} = k_2, b_{20} = k_1 + k_2 \end{cases} \quad (13)$$

Figure 10:
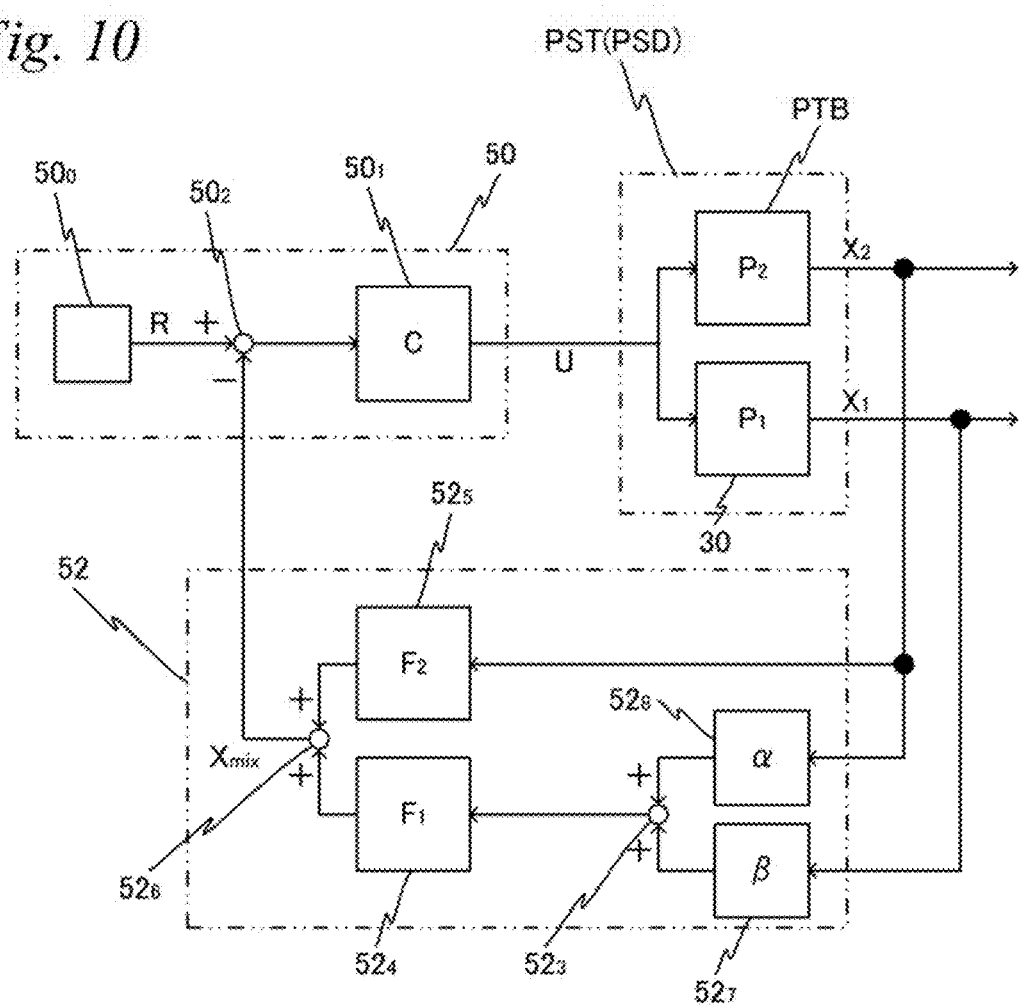
FIG. 10 is a block diagram expressing a feedback control system (FS-SRC) of a single-input two-output system for the two-resonance two-inertial spring type model in FIG. 9.

Incidentally, to this two-resonance two-inertial spring type model, instead of the feedback control system expressed by the block diagram in FIG. 6, a feedback control system expressed by a block diagram in FIG. 10 is employed. That is, comparators (proportional gains β, α) $52_1$, $52_2$ in FIG. 6 are replaced by controllers (transfer functions β, α) $52_7$, $52_8$ in FIG. 10. Corresponding to this, proportional gains β, α are replaced to transfer functions β=β (s), α=α (s). For the sake of convenience, the transfer functions will be expressed using the same notations as proportional gains β, α.

For the two-resonance two-inertial spring type model, transfer functions α, β are determined in the following manner.

$$\begin{cases} \alpha = (M_2 s^2 + c_0 s + k_0) \dfrac{\omega_{np}^2}{s^2 + 2\zeta\omega_{np}s + \omega_{np}^2} P_2(0) \\ \beta = (M_1 s^2 + c_1 s + k_1) \dfrac{\omega_{np}^2}{s^2 + 2\zeta\omega_{np}s + \omega_{np}^2} P_2(0) \end{cases} \quad (14)$$

However, $P_2$ is given as follows.

$$P_2(0) = \frac{k_1 + k_2}{k_1 k_2 + k_0(k_1 + k_2)} \quad (15)$$

Because deciding transfer functions α, β are similar to deciding in the inverted pendulum model previously described, details thereabout will be omitted. By this, transfer characteristic of $X_3=\alpha X_2+\beta X_1$ with respect to thrust F has a characteristic of an ideal secondary low pass filter as follows.

$$P_3 = \frac{X_3}{F} = \frac{\omega_{np}^2}{s^2 + 2\zeta\omega_{np}s + \omega^2} P_2(0) \quad (16)$$

Here, ζ and $\omega_n p$ can each be designed arbitrarily, and are an attenuation ratio (damping factor) and a natural angular frequency of an ideal secondary low pass filter characteristic from thrust F to $X_3$.

Note that transfer functions α, β do not depend on viscosity coefficient $c_2$ due to friction between the first and the second rigid bodies, that is, do not depend on parameters that may change according to the state between plate stage PST and carriage 30 which are equivalent to the first and the second rigid bodies. This means that the resonance mode of $P_1$, $P_2$ in the closed loop transfer function is cancelled out and that the behavior of the closed loop transfer function remains unchanged to changes in the state between plate stage PST and carriage 30.

The inventors verified by simulation the performance of the feedback control system (FS-SRC) based on the SIMO system designed in the manner described above. Further, for comparison, the inventors also verified the performance of a feedback control system (called a PID) of a conventional single-input single-output system (SISO system), made up of a combination of a PID type controller and a notch filter (for example, refer to Japanese Unexamined Patent Application Publication No. 2006-203113), and a conventional SRC type feedback control system (called an SRC) that uses the first and the second controlled variables ($X_2$, $X_1$) without performing filter synthesis.

Dynamical motion (response characteristic) of plate stage PST is reproduced using the inverted pendulum model previously described. Here, values are used of the dynamic parameter compiled in the table of FIG. 8B. Further, a PID type controller was employed for the controller (such as C) used in FS-SRC and SRC. Further, the controller was designed in the same pole placement, along with the three feedback control systems. Further, in the SRC, to remove the offset between the reference position (installation position of movable mirror 17X and corner cube $17X_1$) on position measurement of interferometers 18X, $18X_1$, a secondary high pass filter with a cutoff frequency fc=5 Hz was added to the controller of interferometer $18X_1$ (controlled variable $X_2$). Filters $52_1$, $52_2$ of FS-SRC are secondary filters, with a cutoff frequency of 1 Hz.

Figure 11:
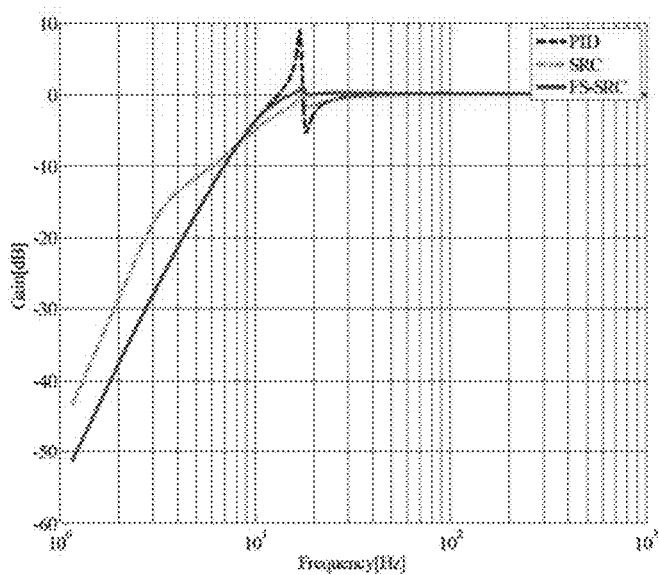
FIG. 11 is a Bode diagram (simulation results) showing a frequency response characteristic of a closed loop transfer function for a feedback control system (PID) in the conventional SISO system, a feedback control system (SRC) in the conventional SIMO system, and a feedback control system (FS-SRC) in the SIMO system of the present embodiment, respectively.

FIG. 11 shows a gain diagram which indicates a frequency response characteristic of a sensitivity function (closed loop transfer function) S of FS-SRC by the SIMO system of the present embodiment. Further, for comparison, a gain diagram is also shown which indicates a frequency response characteristic of PID by the conventional SISO system and of SRC by the conventional SIMO system. An abnormal behavior caused by the high pass filter appears at ten-odd Hz in the PID by the conventional SISO system, in the SRC by the conventional SIMO system, and in the FS-SRC by the SIMO system of the present embodiment. However, it can be seen that the degree of the abnormal behavior is sufficiently smaller in the FS-SRC by the SIMO system of the present embodiment than that of the PID by the conventional SISO system and the SRC by the conventional SIMO system.

Further, because the high pass filter was added to the SRC, sensitivity performance equal to the PID cannot be obtained in the low frequency range even though the controller was designed in the same pole placement. In contrast, sensitivity characteristic of the FS-SRC becomes equal to the PID in the low frequency range, and furthermore shows an ideal sensitivity characteristic without any abnormal behavior being generated by the resonance mode.

Figure 12:
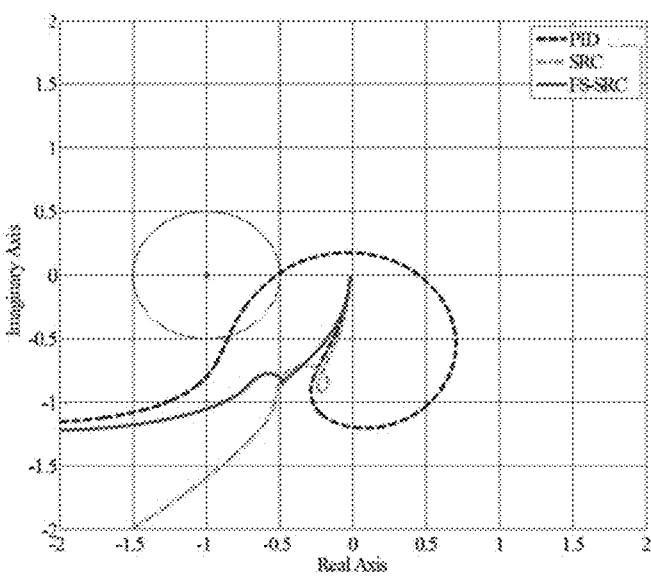
FIG. 12 is a Nyquist diagram for each of the feedback control system (PID) in the conventional SISO system, the feedback control system (SRC) in the conventional SIMO system, and the feedback control system (FS-SRC) in the SIMO system of the present embodiment.

FIG. 12 shows a Nyquist diagram. It can be seen that both the SRC and the FS-SRC are not affected by the resonance, and that stability margin is sufficiently large when compared to the PID.

As is described so far, according to exposure apparatus 110 related to the present embodiment, on carriage 30 (the second section of the plant) that shows a behavior including a resonance mode in opposite phase to the rigid-body mode that plate table PTB (the first section of the plant) on which interferometer 18X (the first measuring instrument) measuring position (the first controlled variable) $X_2$ of plate stage PST (plant) is installed shows, interferometer $18X_1$ (the second measuring instrument) which measures position (the second controlled variable) $X_1$ of plate stage PST is installed. By using the first and the second measuring instruments, it becomes possible to design a control driving system which can control robust driving of plate stage PST in the high bandwidth.

Further, in the feedback control system of the SIMO system in the present embodiment, the structure is employed where filter processing is performed on the measurement results of interferometer 18X (the first measuring instrument) and interferometer $18X_1$ (the second measuring instrument) to obtain synthetic controlled variable $X_{mix}$, synthetic controlled variable $X_{mix}$ and desired value R are used to obtain control input U, and the control input is given to the plant. Here, synthetic controlled variable $X_{mix}=F_1(\alpha X_2+\beta X_1)+F_2(X_2)$ is obtained by obtaining synthetic quantity ($X_c=\alpha X_2+\beta X_1$) using measurement results ($X_2$, $X_1$) of interferometer 18X (the first measuring instrument) and interferometer $18X_1$ (the second measuring instrument) and gains (or transfer functions) ($\alpha$, $\beta$) corresponding to the measurement results, and synthesizing synthetic quantity ($X_c$) and measurement results ($X_2$, $X_1$) of one of the first and the second measuring instruments, respectively, via high pass filter ($F_1$) and low pass filter ($F_2$) having the same cutoff frequency as the high pass filter.

In the conventional feedback control system of the SIMO system, because there is an offset in the reference position on X position measurement of plate stage PST by the first and the second measuring instruments (interferometers 18X, $18X_1$), that is, an offset in the installation positions of movable mirror 17X and corner cube $17X_1$, to remove this offset, a high pass filter has to be connected to cut the controlled variable in the low frequency band. However, when the bandwidth in which the resonance appears is low and overlaps the frequency band where the controlled variable is cut, because the signal for self-cancelling (to cancel the resonance mode of $P_1$ by the resonance mode of $P_2$) the resonance mode also becomes cut, this may end up reducing the control accuracy. Whereas, in the feedback control system of the SIMO system in the present embodiment, by the structure described above, because synthetic controlled variable $X_{mix}$ is $X_2$ of the plant in the low frequency band where there is no resonance and becomes $\alpha X_2+\beta X_1$ which is unobservable to resonance in the middle and high frequency band where there is resonance, the high pass filter to remove the offset does not have to be connected to the controller, and furthermore, stage controller 50 can be structured using only controller $50_1$ which is designed based on the rigid body model. This allows a driving system which controls robust driving of plate stage PST in the high bandwidth to be designed, regardless of the bandwidth where the resonance appears.

Further, gains (or transfer functions) $\beta$, $\alpha$ are decided so that the poles corresponding to the resonance modes included in each of the transfer functions $P_2$, $P_1$ that express the responses of the first and the second sections (plate table PTB and carriage 30) of plate stage PST are cancelled out in the open loop transfer function $\beta P_1+\alpha P_2$. Furthermore, specific forms of transfer functions $P_2$, $P_1$ are given using a dynamic model (rigid model) which expresses the motion of the first and the second sections as a motion of the two rigid bodies coupled by a spring. This cancels out the resonance behaviors (resonance modes) of $P_2$, $P_1$ in the closed loop transfer function (the resonance mode of the plant is canceled out by a linear sum of an anti-resonant mode of $P_2$ and $P_1$), making it possible to design a driving system which controls robust driving of plate stage PST to any change of state.

Further, because exposure apparatus 110 related to the present embodiment is equipped with a driving system of plate stage PST designed in the manner described above, it becomes possible to accurately and stably drive plate stage PST, which allows exposure accuracy, or in other words, overlay accuracy to be improved.

Incidentally, in the embodiment above, while stabilization of plate stage PST was to be improved by deciding transfer functions ($\alpha$, $\beta$) so that the poles corresponding to the resonance modes included in each of the transfer functions $P_2$, $P_1$ corresponding to the first and the second sections are canceled out in the open loop transfer function $\beta P_1+\alpha P_2$, the present invention is not limited to this. For example, transfer functions ($\alpha$, $\beta$) may be obtained without canceling out the poles corresponding to the resonance modes included in each of the transfer functions $P_2$, $P_1$, by improving the damping effect of the plate stage to stabilize the resonance mode. In the present embodiment, in the Nyquist diagram, the size and the orientation of the circle which shows the resonance mode can be set freely within the respective characteristic range of transfer functions $P_2$, $P_1$. As a guideline for stabilization, for example, transfer functions ($\alpha$, $\beta$) may be set so that the circle showing the resonance mode is in a state positioned almost on the first quadrant and the fourth quadrant (right-half plane), or in other words, in a state barely positioned on the second quadrant and the third quadrant (left-half plane).

Further, in the feedback control system of the SIMO system in present embodiment, while the synthetic quantity ($X_c = \alpha X_2 + \beta X_1$) obtained from the measurement results ($X_2$, $X_1$) of interferometer 18X (the first measuring instrument) and interferometer $18X_1$ (the second measuring instrument) and measurement results ($X_2$, $X_1$) of one of the first and the second measuring instruments were synthesized via high pass filter ($F_1$) and low pass filter ($F_2$), respectively, instead of the high pass filter and the low pass filter, for example, the synthesization can be performed a using a bandpass filter, a notch filter and the like. That is, as long as the structure is a structure in which synthetic controlled variable $X_{mix}$ is obtained by synthesizing the frequency band where there is a resonance mode of synthetic quantity ($X_c$) and the frequency band where there are no resonance modes of measurement results ($X_2$, $X_1$) of one of the first and the second measuring instruments, any filter can be used to structure the feedback control system of the SIMO system.

Further, in the embodiment above, while the case has been described where driving of plate stage PST in the X-axis direction was controlled, the feedback control system can be designed similarly to the case where driving of plate stage PST is controlled in the Y-axis direction and the Z-axis direction, and an equivalent efficacy can be obtained.

A Second Embodiment

Next, a second embodiment of the present invention will be described, using FIGS. 13 to 17. Here, the same reference signs will be used for components the same as the first embodiment previously described, and a detailed description thereabout will also be omitted.

In the feedback control system (FS-SRC) of the SIMO system previously described in the first embodiment, by designing synthetic section 52 focusing on one resonance mode, robust drive control of plate stage PST in the high bandwidth became possible without observing the resonance mode. However, in the case a plurality of resonance modes exist, resonance modes other than the resonance mode being focused on when designing synthetic section 52 will be observed. Therefore, in the feedback control system (FS-SRC) of the present embodiment, synthetic section 52 is designed divided for each frequency band in which each of the plurality of resonance modes exists. The feedback control system having this structure in which the feedback control system (FS-SRC) previously described is expanded into the plurality of resonance modes will be referred to as a MultiFS-SRC.

Figure 13:
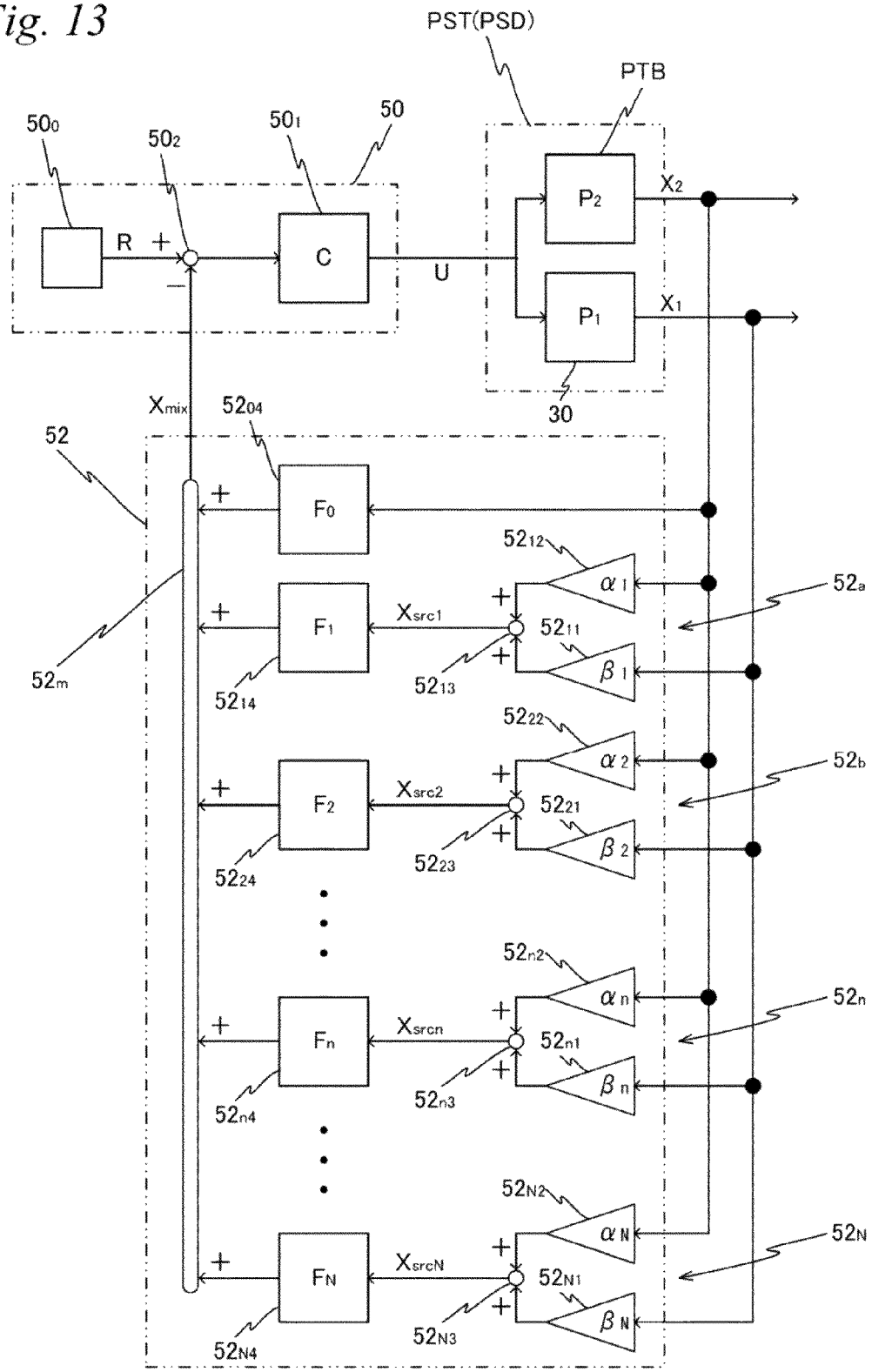
FIG. 13 is a block diagram expressing a feedback control system (MultiFS-SRC) of a single-input two-output system related to a second embodiment.

FIG. 13 shows a block diagram showing a closed loop control system (feedback control system) of a single-input two-output system (SIMO system) corresponding to the driving system of plate stage PST related to the present embodiment. Compared to the feedback control system (FS-SRC) of the SIMO system in the first embodiment, only the design of synthetic section 52 differs. Therefore, the description will be made only on design of synthetic section 52. However, there is to be a plurality of resonance modes, and of such modes, N ($\geq$2) resonance modes will be taken into consideration.

Synthetic section 52 includes N sets of comparators (proportional gains $\beta_n$, $\alpha_n$) $52_{n1}$, $52_{n2}$, adder $52_{n3}$ (n=1 to N), N+1 filter $52_{n4}$ (n=0 to N), and one adder $52_m$.

By the $n^{th}$ set of comparators $52_{n1}$, $52_{n2}$ and adder $52_{n3}$ synthesizing X position $X_2$ (current position) of plate table PTB (transfer function $P_2$) measured by interferometer 18X and X position $X_1$ (current position) of carriage 30 (transfer function $P_1$) measured by interferometer $18X_1$, an intermediate synthetic quantity ($X_{srcn}$) is generated. Here, comparators (proportional gains $\beta_n$, $\alpha_n$) $52_{n1}$, $52_{n2}$ multiply measurement results $X_1$, $X_2$ from interferometers $18X_1$, 18X by proportional gains $\beta_n$, $\alpha_n$ times ($\beta_n X_1$, $\alpha_n X_2$), respectively, and sends the results to adder $52_{n3}$. Adder $52_{n3}$ generates a sum ($\alpha_n X_2 + \beta_n X_1$) of the outputs from comparators $52_{n1}$, $52_{n2}$, and supplies the sum as the intermediate synthetic quantity ($X_{srcn} = \alpha_n X_2 + \beta_n X_1$) to filter $52_{n4}$. N sets of comparators $52_{n1}$, $52_{n2}$ and adder $52_{n3}$ (n=1 to N) are all structured in a similar manner.

N sets of comparators $52_{n1}$, $52_{n2}$ (n=1 to N) are each designed, focusing on the $n^{th}$ resonance mode. The details are as is described in the first embodiment, and an appropriate model that shows the $n^{th}$ resonance mode is employed and proportional gains $\beta_n$, $\alpha_n$ of comparators $52_{n1}$, $52_{n2}$ are decided.

N filter $52_{n4}$ (n=1 to N) performs filter processing Fn ($X_{srcn}$) on each input signal (intermediate synthetic quantity $X_{srcn}$) and supplies the signals to adder $52_m$. Here, passing band of filter $52_{n4}$ includes resonance frequency $\omega_n$ of the corresponding $n^{th}$ resonance mode and the frequency band around resonance frequency $\omega_n$. However, the passing band of N filter $52_{n4}$ (n=1 to N) is divided to keep the passing bands from overlapping one another.

Meanwhile, X position $X_2$ of plate table PTB (transfer function $P_2$) measured by interferometer 18X is supplied to filter $52_{04}$. Filter $52_{04}$ performs filter processing $F_0(X_2)$ on input signal $X_2$, and supplies the signal to adder $52_m$. Here, in the passing band of filter $52_{n4}$, a band other than the passing band of N filter $52_{n4}$ (n=1 to N), in the present embodiment, a low-frequency band where there is no resonance mode, is included.

Adder $52_m$ synthesizes signal $F_0(X_2)$ from N+1 filter $52_{n4}$ (n=0 to N) and Fn ($X_{srcn}$) and generates synthetic quantity $X_{mix} = F_0(X_2) + \Sigma_{n=1 \; to \; N} F_n(X_{srcn})$ and supplies the quantity to stage controller 50 (subtracter $50_2$).

As a concrete example of N+1 filter $52_{n4}$ (n=0 to N), a filter given by formula (17a) below, and a filter given by formula (17b) are included.

$$\begin{cases} F_0 = \dfrac{\omega_0}{s + \omega_0} \\ F_n = \prod_{m=0}^{n-1} \dfrac{s}{s + \omega_m} \cdot \dfrac{\omega_n}{s + \omega_n} \quad \text{for } 1 \leq n \leq N-1 \\ F_N = \prod_{m=0}^{N-1} \dfrac{s}{s + \omega_n} \end{cases} \quad (17a)$$

$$\begin{cases} F_0 = \prod_{m=1}^{N} N_m \\ F_1 = 1 - N_1 \\ F_n = \prod_{m=1}^{n-1} N_m (1 - N_n) \text{ for } 2 \leq n \leq N \end{cases} \quad (17b)$$

However, in formula (17b) above, function $N_n$ is a notch filter given by formula (18) below.

$$N_n = \frac{s^2 + 2d_n\zeta_n\omega_n s + \omega_n^2}{s^2 + 2\zeta_n\omega_n s + \omega_n^2} \quad (18)$$

Filter $F_0$ is a low pass filter which passes only the frequency band lower than frequency $f_0$ ($=\omega_0/2\pi$) among its input signal ($X_2$). Filter $F_n$ (n=1 to N−1) is a bandpass filter which passes only the frequency band higher than frequency $f_{n-1}$ ($=\omega_{n-1}/2\pi$) and lower than frequency fn ($=\omega_n/2\pi$) among its input signal ($X_{srcn}$) Filter $F_N$ is a high pass filter which passes only the frequency band higher than frequency $f_N(=\omega_N/2\pi)$ among its input signal ($X_{srcn}$).

Both filters of formulas (17a) and (17b) are decided so as to satisfy condition $\Sigma_{n=0\ to\ N}F_n=1$, and the passing bands are not to overlap the respective passing bands of N+1 filter $52_{n4}$ (n=0 to N).

Synthetic quantity $X_{mix}$ generated in the feedback control system (MultiFS-SRC) having the structure described above is the plant $X_2$ in the low frequency band ($\omega<\omega_0$) where there is no resonance, is $X_{srcn}$ in frequency band ($\omega_{n-1}\leq\omega<\omega_n$) where the $n^{th}$ resonance mode exists, and is $X_{srcN}$ in frequency band ($\omega\geq\omega_N$) where the $N^{th}$ resonance mode exists. This allows separation into each frequency band where each of the plurality of resonance modes exist, and to individually design corresponding comparators $52_{n1}$, $52_{n2}$ (n=1 to N) focusing on the respective resonance modes.

The inventors verified by simulation the performance of the feedback control system designed in the manner described above (MultiFS-SRC) and the feedback control system of the first embodiment previously described (FS-SRC).

Figure 14:
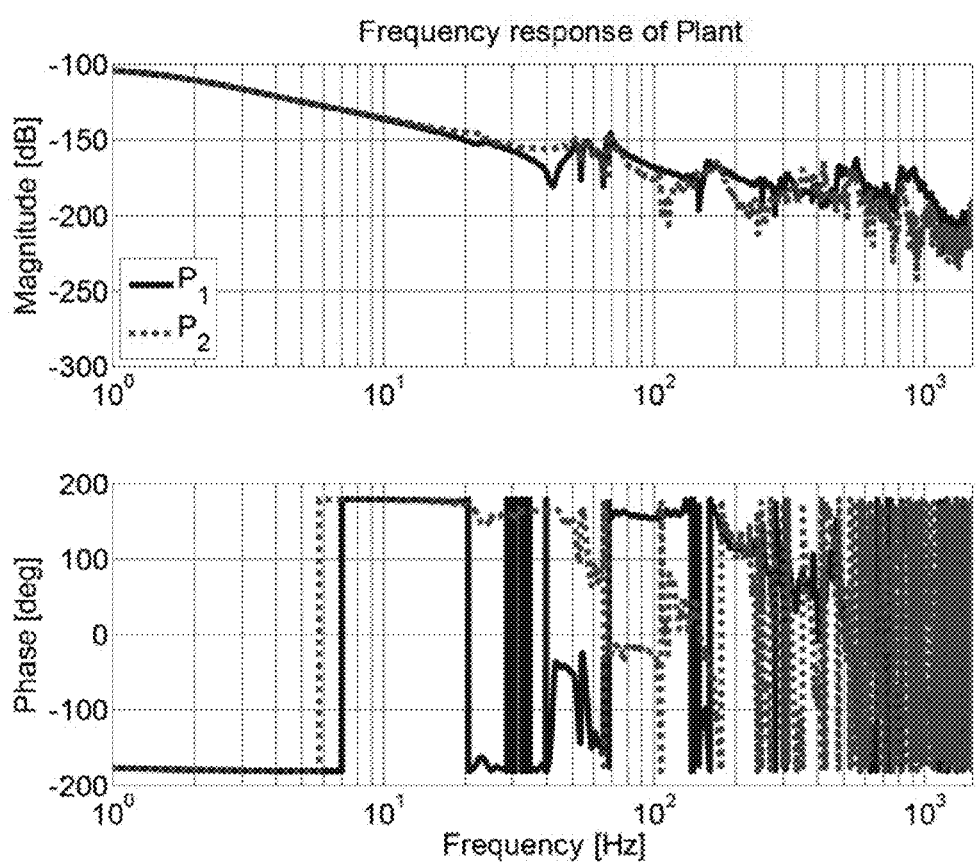
FIG. 14 is a Bode diagram showing a frequency response characteristic of a transfer function which expresses an input-output response of a carriage of a plate stage and a plate table.

FIG. 14 shows plant characteristics $P_1$, $P_2$ of carriage 30 and plate table PTB (a Bode diagram showing frequency response characteristics, that is, a gain diagram (drawing on the upper side) and a phase diagram (drawing on the lower side)) that are subject to simulation. Here, $P_1$, $P_2$ are transfer functions $P_1$ ($=X_1/U$) $P_2$ ($=X_2/U$) expressing input-output responses (controlled variables $X_1$, $X_2$ to control input U (driving force F)) of carriage 30 and plate table PTB, respectively. In plant characteristics $P_1$, $P_2$, a first resonance mode caused by falling of plate table PTB to carriage 30 appears around 20 Hz, and a second resonance mode caused by distortion of plate table PTB appears around 60 Hz.

In the feedback control system (MultiFS-SRC) the control system (synthetic section 52) was designed taking into consideration both of the two resonance modes. Incidentally, to the first resonance mode, comparators $52_{11}$, $52_{12}$ in synthetic section 52 were designed (proportional gains $\beta_1$, $\alpha_1$ were decided) by applying the inverted pendulum model shown in FIG. 8. Further, to the second resonance mode, because a two mass system model such as the inverted pendulum model cannot be applied and a complex continuous body model is required, comparators $52_{21}$, $52_{22}$ were designed (proportional gains $\beta_2$, $\alpha_2$ were decided) by simulation. In the feedback control system (FS-SRC), the control system (synthetic section 52) was designed taking into consideration only the second resonance mode. Similarly to the feedback control system (MultiFS-SRC), comparators $52_1$, $52_2$ in synthetic section 52 were designed (proportional gains $\beta$, $\alpha$ were decided) by simulation.

Figure 15:
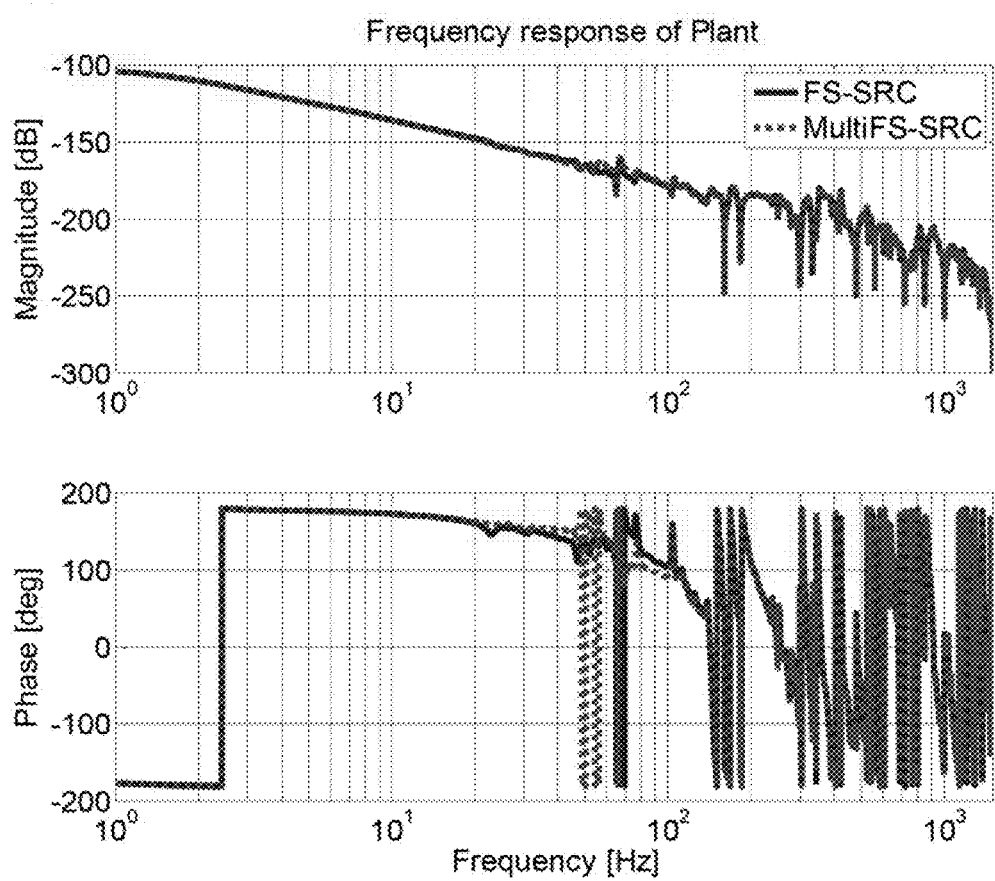
FIG. 15 is a Bode diagram showing a frequency response characteristic of a transfer function which expresses an input-output response of the carriage of the plate stage and the plate table for feedback control systems (FS-SRC and MultiFS-SRC) in a SIMO system.

FIG. 15 shows a plant characteristic $P_2$ of plate table PTB in the case when the two feedback control systems (MultiFS-SRC and FS-SRC) are applied (a Bode diagram showing the frequency response characteristics, that is, a gain diagram (drawing on the upper side) and a phase diagram (drawing on the lower side)). Because synthetic section 52 was designed taking into consideration the second resonance mode in both of the two feedback control systems (MultiFS-SRC and FS-SRC), the resonance mode is made unobservable at around 60 Hz. Meanwhile, in the feedback control system (MultiFS-SRC), because synthetic section 52 is designed taking into consideration the first resonance mode, the resonance mode is made unobservable at around 20 Hz, whereas in the feedback control system (FS-SRC), because the first resonance mode is not taken into consideration, the resonance mode appears at around 20 Hz.

Figure 16:
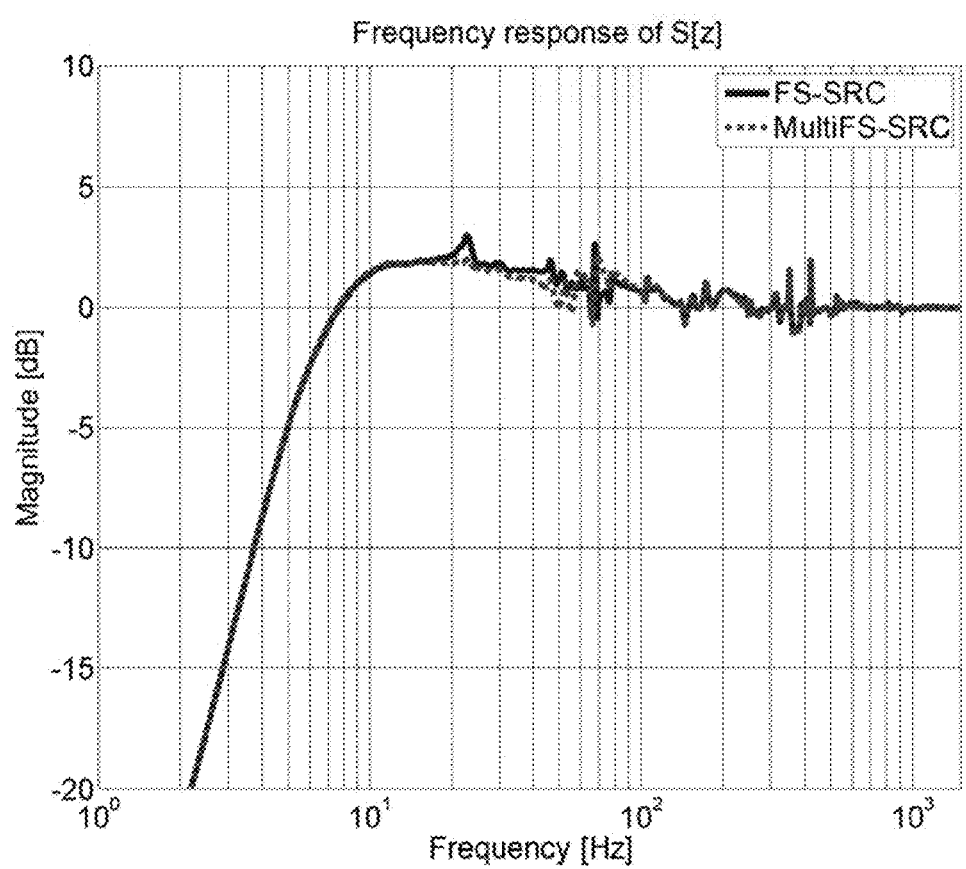
FIG. 16 is a Bode diagram showing a frequency response characteristic of a closed loop transfer function for the feedback control systems (FS-SRC and MultiFS-SRC) in the SIMO system.

FIG. 16 shows a sensitivity function (closed loop transfer function) in the case when the two feedback control systems (MultiFS-SRC and FS-SRC) are applied. In both of the two feedback control systems (MultiFS-SRC and FS-SRC), the resonance mode is made unobservable at around 60 Hz. Meanwhile, in the feedback control system (MultiFS-SRC), while the resonance mode at around 20 Hz is made unobservable, in the feedback control system (FS-SRC), a peak deriving from the first resonance mode appears.

Figure 17:
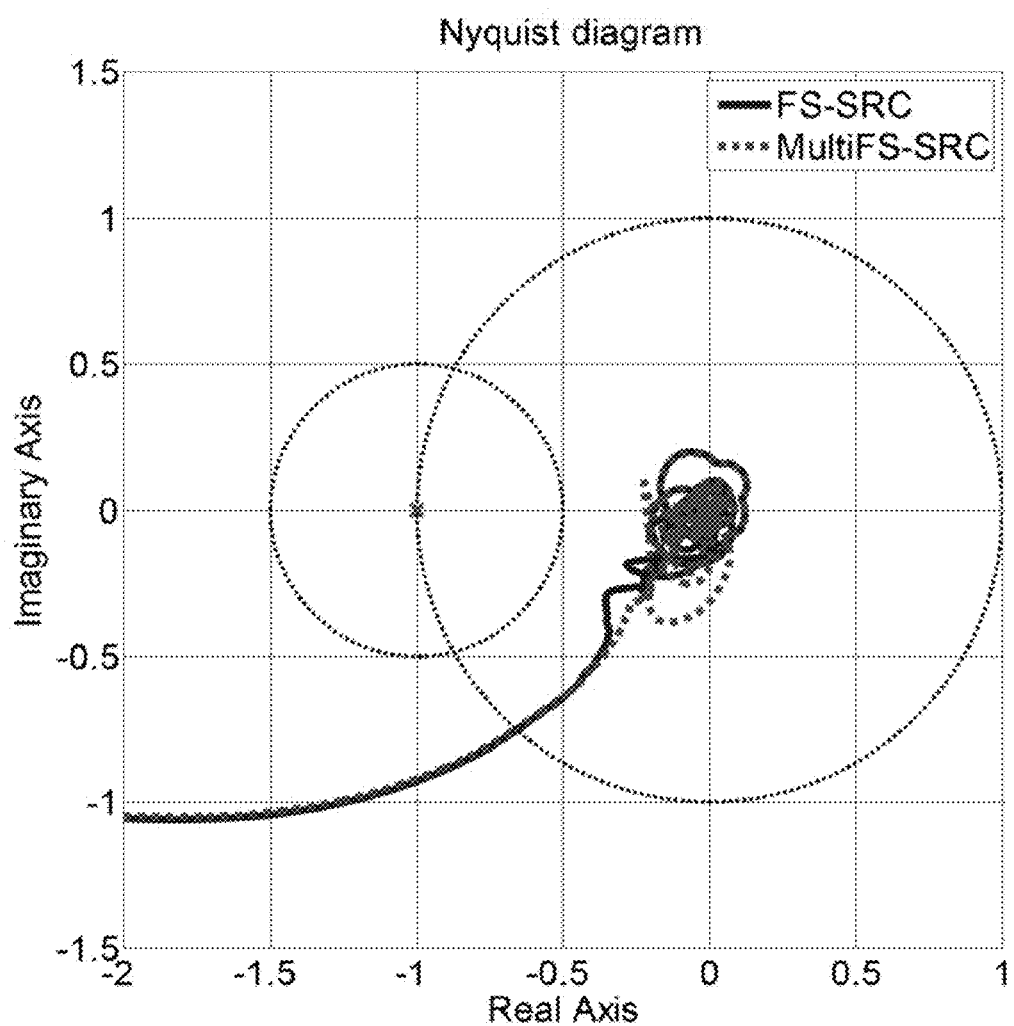
FIG. 17 is a Nyquist diagram for each of the feedback control systems (FS-SRC and MultiFS-SRC) in the SIMO system.

FIG. 17 shows a Nyquist diagram in the case when the two feedback control systems (MultiFS-SRC and FS-SRC) are applied. As for feedback control system (FS-SRC), it can be seen that the locus nears point (−1, 0) at around point (−0.3, −0.3), deriving from the first resonance mode. Meanwhile, in the feedback control system (MultiFS-SRC), because the first resonance mode is also made unobservable, the locus does not approach point (−1, 0), and stability margin is secured.

Accordingly, it has been proved that by applying the feedback control system (MultiFS-SRC), the plurality of resonance modes can be made unobservable, and higher stability can be obtained.

As is described so far, in the feedback control system (MultiFS-SRC) of the SIMO system in the present embodiment, a plurality of synthetic quantities ($X_{cn}=\alpha_n X_2+\beta_n X_1$ (n=1 to N)) is obtained using measurement results ($X_2$, $X_1$) of interferometer 18X (the first measuring instrument) and interferometer 18$X_1$ (the second measuring instrument) and transfer functions ($\alpha_n$, $\beta_n$ (n=1 to N)) of a plurality of sets (N ($\geq 2$) sets), and by performing filter processing on the plurality of synthetic quantities and measurement result ($X_2$) of interferometer 18X (the first measuring instrument), synthetic controlled variable $X_{mix}=F_0(X_2)+\Sigma_{n=1\ to\ N}F_n(\alpha_n X_2+\beta_n X_1)$ is obtained. Here, comparators $52_{n1}$, $52_{n2}$ (n=1 to N) are designed individually (proportional gains $\beta_n$, $\alpha_n$ are decided) so as to perform separation into each frequency band in which the plurality of resonance modes exist and to respond focusing on the respective resonance modes. This can make the plurality of resonance modes unobservable, and a driving system that can control the driving of plate stage PST with a higher stability can be obtained.

Incidentally, in the first and the second embodiments described above, the structure was employed where the position of the first section (plate table PTB) (the first controlled variable $X_2$) and the position of the second section (carriage 30) (the second controlled variable $X_1$) of plate stage PST were measured, respectively, using interferometer 18X (the first measuring instrument) and interferometer 18$X_1$ (the second measuring instrument) of plate interferometer system 18. Instead of this, for example, a structure can be employed where the first measuring instrument measures the position of the first section (plate table PTB) with the position of the second section (carriage 30) serving as a reference. On the contrary, a structure can be employed where the second measuring instrument measures the position of the second section (carriage 30) with the position of the first section (plate table PTB) serving as a reference. That is, a structure can be employed where one of the first and the second measuring instruments measures a relative position between the first section (plate table PTB) and the second section (carriage 30) of plate stage PST. In such a case, one of the measuring instruments is not limited to the interferometer, and for example, it is also possible to use an encoder which irradiates a measurement beam using a head provided on one of plate table PTB and carriage 30 onto a scale provided on the other of plate table PTB and carriage 30 and receives the return light.

Further, the structure of plate interferometer system 18 is not limited to the structure described above, and according to the purpose, a structure in which an interferometer is added furthermore can also be employed, as appropriate. Further, instead of plate interferometer system 18, or along with plate interferometer system 18, an encoder (or an encoder system structured from a plurality of encoders) can also be used.

Incidentally, each of the embodiments described above is effective in particular in the case when the exposure object is a substrate having a size which is 500 mm or more (on the long side or in diameter).

Further, the illumination light can also be ultraviolet light such as an ArF excimer laser beam (wavelength 193 nm) or a KrF excimer laser beam (wavelength 248 nm), or vacuum-ultraviolet light such as a $F_2$ excimer laser beam (wavelength 157 nm). Further, as the illumination light, for example, a harmonic wave can also be used which is a single-wavelength laser beam in the infrared or visible range emitted by a DFB semiconductor laser or a fiber laser that is amplified by a fiber amplifier doped with, for example, erbium (or both erbium and ytterbium), and whose wavelength is converted into ultraviolet light using a nonlinear optical crystal. Further, a solid-state laser (wavelength: 355 nm, 266 nm) and the like can also be used.

Further, in the embodiments described above, while the case has been described where projection optical system PL is a multi-lens projection optical system which is equipped with a plurality of optical systems, the number of projection optical systems is not limited to this, and the projection optical system can be one or more. Further, the projection optical system is not limited to the multi-lens projection optical system, and for example, can also be an Offner type projection optical system which uses a large mirror. Further, in the embodiments described above, while the case has been described where a system that has an equal magnification was used as projection optical system PL, the present invention is not limited to this, and the projection optical system can also either be a magnifying system or a reduction system.

Further, (the stage driving system in) each of the embodiments described above can also be applied to a collective exposure type or a scanning type exposure apparatus such as a scanning stepper, or to a stationary type exposure apparatus such as a stepper. Further, each of the embodiments above can also be applied to a projection exposure apparatus that employs a step-and-stitch method in which a shot area and a shot area are synthesized. Further, each of the embodiments above can also be applied to an exposure apparatus by a proximity method that does not use any projection optical systems, as well as to a liquid immersion type exposure apparatus that exposes a substrate via an optical system and a liquid. Besides such apparatuses, each of the embodiments above can also be applied to an exposure apparatus such as an exposure apparatus which synthesizes two patterns on a substrate via a projection optical system, and by performing scanning exposure once, performs double exposure of one shot area on the substrate almost simultaneously (U.S. Pat. No. 6,611,316).

Further, the usage of the exposure apparatus is not limited to the exposure apparatus for liquid crystals to transfer a liquid crystal display devices pattern on a square-shaped glass plate, and can also be widely applied, for example, to an exposure apparatus for producing semiconductors, or to an exposure apparatus used to manufacture thin film magnetic heads, micromachines, DNA chips and the like. Further, each of the embodiments above can be applied not only to an exposure apparatus for microdevices such as semiconductor devices but also to an exposure apparatus that transfers a circuit pattern on a glass substrate, a silicon wafer or the like to manufacture a mask or a reticle used in a light exposure apparatus, an EUV exposure apparatus, an X-ray exposure apparatus, an electron beam exposure apparatus and the like. Incidentally, the object subject to exposure is not limited to a glass plate, and can be, for example, other objects such as a wafer, a ceramic substrate, a mask blank or the like.

Electronic devices such as liquid crystal display devices (or semiconductor devices) are manufactured through the steps of; a step in which function/performance design of the device is performed, a step in which a mask (or a reticle) is manufactured based on the design step, a step in which a glass plate (or a wafer) is manufactured, a lithography step in which the pattern of the mask (reticle) is transferred onto the glass plate by the exposure apparatus, and the exposure method described in each of the embodiments above, a development step in which the glass plate that has been exposed is developed, an etching step in which an exposed member of apart other than the part where the resist remains is removed by etching, a resist removing step in which the resist that is no longer necessary is removed when etching has been completed, a device assembly step, an inspection step, and the like. In this case, in the lithography step, because the device pattern is formed on the glass plate by executing the exposure method previously described using the exposure apparatus described above, a highly integrated device can be produced with good productivity.

Incidentally, the disclosures of all the Publications and U.S. patents that are cited in the description so far related to exposure apparatuses and the like are each incorporated herein by reference.

What is claimed is:

1. A driving system which drives a plant by giving control input, the system comprising:
    a first measuring instrument which measures a first controlled variable related to a position of a first section of the plant;
    a second measuring instrument which measures a second controlled variable related to a position of a second section of the plant that shows a behavior including a resonance mode in opposite phase to a rigid-body mode that the first section shows; and
    a controller which obtains a third controlled variable by obtaining synthetic quantity ($X_c = \alpha X_2 + \beta X_1$) using measurement results of the first and the second controlled variables ($X_2$, $X_1$) by the first and the second measuring instruments and transfer function ($\alpha$, $\beta$), and by performing a filter processing on the synthetic quantity and one of measurement results of the first and the second measuring instruments, and gives the control input obtained using the third controlled variable to the plant.

2. The driving system according to claim 1, wherein the transfer function ($\alpha$, $\beta$) is decided so that a pole corresponding to the resonance mode included in each of transfer functions $P_2$, $P_1$ corresponding to the first and the second sections are canceled out in transfer function $\alpha P_2 + \beta P_1$.

3. The driving system according to claim 2, wherein a specific form of the transfer functions $P_2$, $P_1$ is given using a dynamic model which expresses motion of the first and the second sections as a motion of at least two or more rigid bodies coupled by a spring or a spring and a damper.

4. The driving system according to claim 1, wherein the controller obtains the third controlled variable by performing filter processing on the synthetic quantity ($X_c$) and the one of the measurement results ($X_2$, $X_1$), and by synthesizing a frequency band in which the resonance mode of the synthetic quantity ($X_c$) exists and a frequency band in which the resonance mode of the one of the measurement results ($X_2$, $X_1$) is non-existent.

5. The driving system according to claim 4, wherein the controller obtains the third controlled variable ($X_3$=Fh ($X_c$)+Fl($X_2$, $X_1$)) by synthesizing the synthetic quantity ($X_c$) and the one of the measurement results ($X_2$, $X_1$) via a high pass filter (Fh) and a low pass filter (Fl) having a cutoff frequency the same as the high pass filter, respectively.

6. The driving system according to claim 1, wherein the transfer function ($\alpha$, $\beta$) is expressed by gain.

7. An exposure apparatus that exposes an object with an energy beam and forms a pattern on the object, the apparatus comprising:
the driving system according to claim 1 in which a movable body that holds the object and moves on a predetermined plane serves as the plant.

8. The exposure apparatus according to claim 7, wherein the movable body has a first movable body that moves holding the object, and a second movable body that moves on the predetermined plane holding the first movable body, and
the first and the second sections of the plant are included in the first and the second movable bodies, respectively.

9. A driving system which drives a plant by giving a control input, the system comprising:
a first measuring instrument which measures a first controlled variable related to a position of a first section of the plant;
a second measuring instrument which measures a second controlled variable related to a position of a second section of the plant that shows a behavior including a resonance mode in opposite phase to a rigid-body mode that the first section shows; and
a controller which obtains a third controlled variable by obtaining a plurality of synthetic quantities ($X_{cn}=\alpha_n X_2 + \beta_n X_1$ (n=1 to N)) using measurement results of the first and the second controlled variables ($X_2$, $X_1$) by the first and the second measuring instruments and a plurality of sets (N ($\geq$2) sets) of transfer function ($\alpha_n$, $\beta_n$ (n=1 to N)) and performing filter processing on the plurality of synthetic quantities and one of the measurement results of the first and the second measuring instruments, and gives the control input which is obtained using the third controlled variable to the plant.

10. The driving system according to claim 9, wherein an $n^{th}$ set transfer function ($\alpha_n$, $\beta_n$) of the plurality of sets of transfer functions is decided so that poles corresponding to an $n^{th}$ resonance mode included in transfer functions $P_2$, $P_1$, respectively, corresponding to the first and the second sections are canceled out in transfer function $\alpha_n P_2 + \beta_n P_1$.

11. The driving system according to claim 10, wherein a specific form of the transfer functions $P_2$, $P_1$ is given, using a dynamic model which expresses a motion of the first and the second sections as a motion of at least two or more rigid bodies coupled by a spring or a spring and a damper.

12. The driving system according to claim 10, wherein the controller obtains the third controlled variable by performing filter processing on the plurality of synthetic quantities ($X_{cn}$ (n=1 to N)) and the one of the measurement results ($X_2$, $X_1$), and synthesizing a frequency band in which resonance modes corresponding to each of the plurality of synthetic quantities ($X_{cn}$ (n=1 to N)) exist and a frequency band other than the frequency band of the one of the measurement results ($X_2$, $X_1$).

13. The driving system according to claim 9, wherein the transfer function is expressed by gain.

14. The driving system according to claim 9, wherein one of the first and the second measuring instruments measures a controlled variable with a position subject to measurement of an other of the first and the second measuring instruments serving as a reference.

15. An exposure apparatus that exposes an object with an energy beam and forms a pattern on the object, the apparatus comprising:
the driving system according to claim 9 in which a movable body that holds the object and moves on a predetermined plane serves as the plant.

16. The exposure apparatus according to claim 15, wherein
the movable body has a first movable body that moves holding the object, and a second movable body that moves on the predetermined plane holding the first movable body, and
the first and the second sections of the plant are included in the first and the second movable bodies, respectively.

17. An exposure apparatus that exposes an object with an energy beam and forms a pattern on the object, the apparatus comprising:
a movable body which has a first movable body that moves holding the object, and a second movable body that moves on a predetermined plane holding the first movable body;
a first measuring instrument that measures a first controlled variable related to a position of the first movable body and a second measuring instrument that measures a second controlled variable related to a position of the second movable body; and
a controller which obtains a third controlled variable by obtaining an N synthetic quantity ($X_{cn}=\alpha_n X_2 + \beta_n X_1$ (n=1 to N)) using measurement results of the first and the second controlled variables ($X_2$, $X_1$) by the first and the second measuring instruments and N sets (N$\geq$1), which is one set or more, of transfer functions ($\alpha_n$, $\beta_n$ (n=1 to N)), and by performing a filter processing on the synthetic quantity and one of the measurement results of the first and the second measuring instruments, and drives the movable body by giving the control input obtained using the third controlled variable to the movable body.

18. The exposure apparatus according to claim 17, wherein
the second measuring instrument is placed at a part of the second movable body that shows a behavior including a resonance mode in opposite phase to a rigid-body mode that the first movable body shows.

19. The exposure apparatus according to claim 17, wherein
an $n^{th}$ transfer function ($\alpha$, $\beta_n$) of the N sets of transfer functions is decided, so that poles corresponding to $n^{th}$ resonance modes included in transfer functions $P_2$, $P_1$, respectively, corresponding to the first and the second movable bodies are canceled out in transfer function $\alpha_n P_2 + \beta_n P_1$.

20. The exposure apparatus according to claim 19, wherein
a specific form of the transfer functions $P_2$, $P_1$ is given, using a dynamic model which expresses a motion of the first and the second movable bodies as a motion of at least two or more rigid bodies coupled by a spring or a spring and a damper.

21. The exposure apparatus according to claim 17, wherein
the controller obtains the third controlled variable by performing filter processing on the N synthetic quantity ($X_{cn}$ (n=1 to N)) and the one of the measurement results ($X_2$, $X_1$), and synthesizing a frequency band in which resonance modes corresponding to each of the N synthetic quantities ($X_{cn}$ (n=1 to N)) exist and a frequency band other than the frequency band of the one of the measurement results ($X_2$, $X_1$).

22. The exposure apparatus according to claim 17, wherein
the transfer function is expressed by gain.

23. The exposure apparatus according to claim 17, wherein
one of the first and the second measuring instruments measures a controlled variable with a position subject to measurement of an other of the first and the second measuring instruments serving as a reference.

24. A driving method in which a plant is driven by giving a control input, the method comprising:
measuring a first controlled variable related to a position of a first section of the plant and a second controlled variable related to a position of a second section of the plant that shows a behavior including a resonance mode in opposite phase to a rigid-body mode that first section shows; and
driving the plant by obtaining a third controlled variable by obtaining a synthetic quantity ($X_c = \alpha X_2 + \beta X_1$) using the measurement results of the first and the second controlled variables ($X^2$, $X_1$) and transfer function ($\alpha$, $\beta$), and performing a filter processing on the synthetic quantity and one of the measurement results of the first and the second controlled variables, and giving the control input obtained using the third controlled variable to the plant.

25. The driving method according to claim 24, wherein
the transfer function ($\alpha$, $\beta$) is decided so that a pole corresponding to the resonance mode included in each of transfer functions $P_2$, $P_1$ corresponding to the first and the second sections are canceled out in transfer function $\alpha P_2 + \beta P_1$.

26. The driving method according to claim 25, wherein
a specific form of the transfer functions $P_2$, $P_1$ is given, using a dynamic model which expresses a motion of the first and the second sections as a motion of at least two or more rigid bodies coupled by a spring or a spring and a damper.

27. The driving method according to claim 24, wherein
in the driving, the third controlled variable is obtained by performing filter processing on the synthetic quantity ($X_c$) and the one of the measurement results ($X_2$, $X_1$) and synthesizing a frequency band in which the resonance mode of the synthetic quantity ($X_c$) exists and a frequency band in which the resonance mode of the one of the measurement results ($X_2$, $X_1$) is non-existent.

28. The driving method according to claim 27, wherein
in the driving, the third controlled variable ($X_3 = Fh(X_c) + Fl(X_2, X_1)$) is obtained, by synthesizing the synthetic quantity ($X_c$) which passes through a high pass filter (Fh) and the one of the measurement results ($X_2$, $X_1$) which passes through a low pass filter (Fl) having a same cutoff frequency as the high pass filter.

29. The driving method according to claim 24, wherein
the transfer function ($\alpha$, $\beta$) is expressed by gain.

30. An exposure method that exposes an object with an energy beam and forms a pattern on the object, the method comprising:
driving a movable body that holds the object and moves on a predetermined plane as the plant by the driving method according to claim 24.

31. The exposure method according to claim 30, wherein
the movable body has a first movable body that moves holding the object, and a second movable body that moves on the predetermined plane holding the first movable body, and
the first and the second sections of the plant are included in the first and the second movable bodies, respectively.

32. A driving method in which a plant is driven by giving a control input, the method comprising:
measuring a first controlled variable related to a position of a first section of the plant and a second controlled variable related to a position of a second section of the plant that shows a behavior including a resonance mode in opposite phase to a rigid-body mode that the first section shows; and
driving the plant by obtaining a third controlled variable by obtaining a plurality of synthetic quantities ($X_{cn} = \alpha_n X_2 + \beta_n X_1$ (n=1 to N)) using measurement results of the first and the second controlled variables ($X_2$, $X_1$) and a plurality of sets (N (N≥2) sets) of transfer function ($\alpha_n$, $\beta_n$ (n=1 to N)), performing filter processing on the plurality of synthetic quantities and one of the measurement results of the first and the second controlled variables, and giving the plant the control input which is obtained using the third controlled variable.

33. The driving method according to claim 32, wherein
an $n^{th}$ set transfer function ($\alpha_n$, $\beta$) of the plurality of sets of transfer functions is decided so that poles corresponding to an $n^{th}$ resonance mode included in transfer functions $P_2$, $P_1$, respectively, corresponding to the first and the second sections are canceled out in transfer function $\alpha_n P_2 + \beta_n P_1$.

34. The driving method according to claim 33, wherein
a specific form of the transfer functions $P_2$, $P_1$ is given, using a dynamic model which expresses a motion of the first and the second sections as a motion of at least two or more rigid bodies coupled by a spring or a spring and a damper.

35. The driving method according to claim 33, wherein in the driving, the third controlled variable is obtained by performing filter processing on the plurality of synthetic quantities ($X_{cn}$ (n=1 to N)) and the one of the measurement results ($X_2$, $X_1$), and synthesizing a frequency band in which a resonance mode corresponding to each of the plurality of synthetic quantities ($X_{cn}$ (n=1 to N)) exist and a frequency band other than the frequency band of the one of the measurement results ($X_2$, $X_1$).

36. The driving method according to claim 32, wherein the transfer function is expressed by gain.

37. The driving method according to claim 32, wherein in the measuring, one of the first and the second controlled variables is measured with an other of the first and the second controlled variables serving as a reference.

38. An exposure method that exposes an object with an energy beam and forms a pattern on the object, the method comprising:
driving a movable body that holds the object and moves on a predetermined plane as the plant by the driving method according to claim 32.

39. The exposure method according to claim 38, wherein the movable body has a first movable body that moves holding the object, and a second movable body that moves on the predetermined plane holding the first movable body, and
the first and the second sections of the plant are included in the first and the second movable bodies, respectively.

40. An exposure method that exposes an object with an energy beam and forms a pattern on the object, the method comprising:
measuring a first controlled variable related to a position of a first movable body which moves holding the object, and a second controlled variable related to a position of a second movable body which moves on a predetermined plane holding the first movable body; and
driving a movable body by obtaining a third controlled variable, which is obtained by obtaining an N synthetic quantity ($X_{cn} = \alpha_n X_2 + \beta_n X_1$ (n=1 to N)) using measurement results of the first and the second controlled variables ($X_2$, $X_1$)) and N sets (N≥1), which is one set or more, of transfer functions ($\alpha_n$, $\beta_n$ (n=1)), and by performing a filter processing on the synthetic quantity and one of the measurement results of the first and the second controlled variables.

41. The exposure method according to claim 40, wherein in the measuring, the second controlled variable related to a position of a part of the second movable body that shows a behavior including a resonance mode in opposite phase to a rigid-body mode that the first movable body shows is measured.

42. The exposure method according to claim 40, wherein an $n^{th}$ set transfer function ($\alpha_n$, $\beta_n$) of the N sets of transfer functions is decided so that poles corresponding to an $n^{th}$ resonance mode included in transfer functions $P_2$, $P_1$, respectively, corresponding to the first and the second movable bodies are canceled out in transfer function $\alpha_n P_2 + \beta_n P_1$.

43. The exposure method according to claim 42, wherein a specific form of the transfer functions $P_2$, $P_1$ is given, using a dynamic model which expresses a motion of the first and the second movable bodies as a motion of at least two or more rigid bodies coupled by a spring or a spring and a damper.

44. The exposure method according to claim 40, wherein in the driving, the third controlled variable is obtained by performing filter processing on the N synthetic quantity ($X_{cn}$ (n=1 to N)) and the one of measurement results ($X_2$, $X_1$), and synthesizing a frequency band in which resonance modes corresponding to each of the N synthetic quantities ($X_{cn}$ (n=1 to N)) exist and a frequency band other than the frequency band of the one of the measurement results ($X_2$, $X_1$).

45. The exposure method according to claim 40, wherein the transfer function is expressed by gain.

46. The exposure method according to claim 40, wherein in the measuring, one of the first and the second controlled variables is measured using an other of the first and the second controlled variables as a reference.

47. A device manufacturing method, comprising:
forming a pattern on an object using the exposure method according to claim 38, and
developing the object on which the pattern is formed.

48. A device manufacturing method, comprising:
forming a pattern on an object using the exposure method according to claim 46, and
developing the object on which the pattern is formed.

* * * * *